(12) United States Patent
Nagasaka et al.

(10) Patent No.: US 7,705,968 B2
(45) Date of Patent: Apr. 27, 2010

(54) PLATE MEMBER, SUBSTRATE HOLDING DEVICE, EXPOSURE APPARATUS AND METHOD, AND DEVICE MANUFACTURING METHOD

(75) Inventors: Hiroyuki Nagasaka, Kumagaya (JP); Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 477 days.

(21) Appl. No.: 10/594,963

(22) PCT Filed: Mar. 20, 2006

(86) PCT No.: PCT/JP2006/005535

§ 371 (c)(1),
(2), (4) Date: Nov. 14, 2006

(87) PCT Pub. No.: WO2006/098472

PCT Pub. Date: Sep. 21, 2006

(65) Prior Publication Data

US 2008/0049209 A1 Feb. 28, 2008

(30) Foreign Application Priority Data

Mar. 18, 2005 (JP) ............................. 2005-079111

(51) Int. Cl.
*G03B 27/58* (2006.01)
*G03B 27/52* (2006.01)
*G03B 27/42* (2006.01)

(52) U.S. Cl. ............................ 355/72; 355/30; 355/53

(58) Field of Classification Search .................. 355/30, 355/53, 72
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 5,610,683 A | 3/1997 | Takahashi |
| 5,715,039 A | 2/1998 | Fukuda et al. |

(Continued)

FOREIGN PATENT DOCUMENTS

DE 221 563 A1 4/1985

(Continued)

OTHER PUBLICATIONS

Shoten; "Physics of Surface Tension: Drops, Bubbles, Pearls, Waves;" pp. 6-9; Sep. 25, 2003; with partial translation.

*Primary Examiner*—Alan A Mathews
*Assistant Examiner*—Mesfin T Asfaw
(74) *Attorney, Agent, or Firm*—Oliff & Berridge, PLC

(57) ABSTRACT

A substrate holder PH includes a first holder PH1 which holds a substrate P, a liquid-repellent inner surface Tc of a plate member T which faces a side surface Pc of the substrate P held on the first holder PH1 via a predetermined gap A, and a chamfered portion C provided on an upper portion of the inner surface Tc. On the side surface Pc of the substrate P, a liquid-repellent area is provided, and the chamfered portion C is provided so as to face the liquid-repellent area of the substrate P held on the first holder PH1. Thereby, a substrate holding device which can restrain inflow of the liquid into the back surface side of the substrate is provided.

39 Claims, 7 Drawing Sheets

U.S. PATENT DOCUMENTS

| | | | |
|---|---|---|---|
| 5,825,043 | A | 10/1998 | Suwa |
| 5,969,441 | A | 10/1999 | Loopstra et al. |
| 6,208,407 | B1 | 3/2001 | Loopstra |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,581,438 | B1 * | 6/2003 | Hall et al. .................. 73/53.01 |
| 6,590,634 | B1 | 7/2003 | Nishi et al. |
| 2004/0160582 | A1 * | 8/2004 | Lof et al. ...................... 355/30 |
| 2004/0165159 | A1 | 8/2004 | Lof et al. |

FOREIGN PATENT DOCUMENTS

| | | |
|---|---|---|
| DE | 224 448 A1 | 7/1985 |
| EP | 1 420 298 A2 | 5/2004 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-305915 | 10/1992 |
| JP | A 4-305917 | 10/1992 |
| JP | A 5-62877 | 3/1993 |
| JP | A 6-124873 | 5/1994 |
| JP | A 7-220990 | 8/1995 |
| JP | A 8-316125 | 11/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-135400 | 5/1999 |
| JP | A 11-176727 | 7/1999 |
| JP | A 2000-58436 | 2/2000 |
| JP | A 2000-505958 | 5/2000 |
| JP | A 2000-164504 | 6/2000 |
| JP | A 2005-012194 | 1/2005 |
| JP | A 2005-045232 | 2/2005 |
| JP | A 2005-191557 | 7/2005 |
| JP | A 2005-302880 | 10/2005 |
| WO | WO 99/49504 A1 | 9/1999 |
| WO | WO 01/35168 A1 | 5/2001 |
| WO | WO 2004/019128 A2 | 3/2004 |
| WO | WO 2004/053953 A1 | 6/2004 |
| WO | WO 2004/055803 A1 | 7/2004 |
| WO | WO 2004/057590 A1 | 7/2004 |
| WO | WO 2005/029559 A1 | 3/2005 |

* cited by examiner (A)

(B)

(C)

(A)

(B)

PLATE MEMBER, SUBSTRATE HOLDING DEVICE, EXPOSURE APPARATUS AND METHOD, AND DEVICE MANUFACTURING METHOD

TECHNICAL FIELD

The present invention relates to a plate member arranged in the vicinity of a substrate, a substrate holding device for holding a substrate, exposure apparatus and method for exposing a substrate, and a device manufacturing method.

BACKGROUND ART

In a photolithography process as one of manufacturing processes for a microdevice such as a semiconductor device or a liquid crystal display device, an exposure apparatus which transfers a pattern formed on a mask to a substrate is used. This exposure apparatus has a mask stage that is movable while holding a mask and a substrate stage that is movable while holding a substrate, and transfers a pattern of a mask to a substrate via the projection optical system while successively moving the mask stage and the substrate stage. In microdevice manufacturing, for higher density of the device, it has been demanded to increase the fineness of the pattern to be formed on the substrate. To meet this demand, higher resolution of the exposure apparatus has been desired. As one of the means for realizing this higher resolution, a liquid immersion exposure apparatus has been proposed which fills an optical path space between a projection optical system and a substrate with a liquid and exposes the substrate via the projection optical system and the liquid as disclosed in Patent Document 1:

Patent document 1: International Publication Pamphlet No. 99/49504

DISCLOSURE OF THE INVENTION

Problem to be Solved by the Invention

When the liquid makes inflow into the back surface side of the substrate via the gap between the substrate and the substrate stage, it may occur various problems. For example, if the back surface of the substrate gets wet due to the liquid that has made inflow into the back surface side of the substrate, it may become impossible for the substrate holder (substrate holding device) to satisfactorily hold the substrate. Alternatively, when a substrate is unloaded from the substrate holder by a predetermined conveyance unit, the damage may spread such that the liquid may adhere to the conveyance system holding the back side of the wet substrate or scatter to the conveyance path.

The present invention has been made taking the foregoing circumstances into consideration, and an object thereof is to provide a plate member which can prevent the liquid from making inflow into the back surface side of the substrate, a substrate holding device, an exposure apparatus, an exposure method, and a device manufacturing method using the exposure apparatus and exposure method.

Means for Solving the Problem

To solve the above-described problem, the invention adopts the following construction made to correspond to the drawings shown in the embodiments. However, parenthesized reference numerals affixed to the respective elements merely exemplify the elements by way of example, with which it is not intended to limit the respective elements.

According to a first aspect of the invention, there is provided a substrate holding device (PH) which holds a substrate (P) to be exposed through a liquid (LQ), the substrate holding device (PH) including a holder (PH1) which holds the substrate (P), a predetermined liquid-repellent surface (Tc) which faces a side surface (Pc) of the substrate (P) held on the holder (PH1) via a predetermined gap (A), and a chamfered portion (C) provided on the upper portion of the predetermined surface (Tc), wherein a liquid-repellent area (A1) that is liquid-repellent is provided on the side surface (Pc) of the substrate (P), and the chamfered portion (C) is provided so as to face the liquid-repellent area (A1) of the substrate (P) held on the holder (PH1).

According to the first aspect of the invention, the chambered portion is formed so as to face the liquid-repellent area on the side surface of the substrate, so that even when the chamfered portion is present, the liquid can be prevented from making inflow into the back surface side of the substrate via the gap between the side surface of the substrate and the predetermined surface.

According to a second aspect of the invention, there is provided an exposure apparatus (EX) including the substrate holding device (PH) according to the above-described aspect, and exposing a substrate (P) held by the substrate holding device (PH) through a liquid (LQ).

According to the second aspect of the invention, a substrate can be exposed by holding it by the substrate holding device which prevents inflow of the liquid.

According to a third aspect of the invention, there is provided a device manufacturing method using the exposure apparatus (EX) according to the above-described aspect.

According to the third aspect of the invention, a device can be manufactured by the exposure apparatus which prevents inflow of the liquid.

According to a fourth aspect of the invention, there is provided an exposure method for exposing a substrate (P) through a liquid (LQ), the exposure method including making the side surface (Pc) of the substrate (P) face the predetermined liquid-repellant surface (Tc) via a predetermined gap (A), and exposing a substrate through the liquid (LQ), wherein a chamfered portion (C) is formed on an upper portion of the predetermined area (Tc), and a liquid-repellant area (A1) having liquid-repellency is provided on the side surface (Pc) of the substrate (P) so as to face the chamfered portion (C).

According to the fourth aspect of the invention, the liquid-repellant area is provided on the side surface of the substrate so as to face the chamfered portion, so that even when the chamfered portion is present on a predetermined surface facing the side surface of the substrate, the liquid can be prevented from making inflow into the back surface side of the substrate via the gap between the side surface of the substrate and the predetermined surface.

According to a fifth aspect of the invention, there is provided a device manufacturing method using the exposure method according to the above-described aspect. According to the fifth aspect of the invention, a device can be manufactured by the exposure method, in which inflow of the liquid is restrained.

According to a sixth aspect of the invention, there is provided a plate member (T) which is used in an exposure apparatus (EX) which exposes a substrate (P) held on a substrate holding device (PH) by irradiating the surface of the substrate (P) with an exposure light beam through a liquid, including:

a predetermined liquid-repellent surface (Tc) which faces a side surface (Pc) of the substrate (P) held on the substrate holding device (PH) via a predetermined gap (A); and a chamfered portion (C) formed on an upper portion of the predetermined surface (Tc), wherein the chamfered portion (C) is provided so as to face a liquid-repellent area (A1) on the side surface (Pc) of the substrate held on the substrate holding device (PH).

According to the sixth aspect of the invention, the chamfered portion is formed so as to face the liquid-repellant area on the side surface of the substrate, so that the liquid can be prevented from making inflow into the back surface side of the substrate via the gap between the side surface of the substrate and the predetermined surface even when the chamfered portion is present.

According to a seventh aspect of the invention, there is provided a substrate holding device (PH) which holds a substrate (P) to be exposed through a liquid (LQ), including:

a holder (PH1) which holds the substrate (P); and a predetermined surface (Tc) which faces a side surface (Pc) of the substrate (P) held on the holder (PH1) via a gap, wherein the predetermined surface (Tc) includes a flat portion (F4) which is substantially parallel to the side surface (Pc) of the substrate (P) held on the holder (PH1) and a chamfered portion (C) extending to the upper side of the flat portion (F4), and a sum of a contact angle ($\theta_P$) of the liquid (LQ) on the side surface (Pc) of the substrate (P) and a contact angle ($\theta_T$) of the liquid (LQ) on the flat portion (F4) of the predetermined surface (Tc) is greater than 180 degrees.

According to the seventh aspect of the invention, even when a chamfered portion is present, inflow of the liquid to the back surface side of the substrate via the gap between the side surface of the substrate and the predetermined surface can be restrained.

According to an eighth aspect of the invention, there is provided an exposure apparatus (EX) which has the substrate holding device (PH) according to the above-described aspect and exposes a substrate (P) held on the substrate holding device (PH) through a liquid (LQ).

According to the eighth aspect of the invention, a substrate can be exposed by holding it by the substrate holding device in which inflow of a liquid is restrained.

According to a ninth aspect of the invention, there is provided a device manufacturing method using the exposure apparatus (EX) according to the above-described aspect.

According to the ninth aspect of the invention, a device can be manufactured by an exposure apparatus in which inflow of a liquid is restrained.

According to a tenth aspect of the invention, there is provided a plate member which is used in an exposure apparatus (EX) for exposing a substrate (P) held on a substrate holding device (PH) by irradiating the surface of the substrate (P) with an exposure light beam through a liquid (LQ), wherein the plate member has a predetermined surface (Tc) which faces a side surface (Pc) of the substrate (P) held on the substrate holding device (PH) via a gap (A), and the predetermined surface (Tc) includes a flat portion (F4) which is substantially parallel to the side surface (Pc) of the substrate (P) held on the substrate holding device (PH) and a chamfered portion (C) extending to the upper side of the flat portion, and a sum of a contact angle ($\theta_P$) of the liquid (LQ) on the side surface (Pc) of the substrate (P) and a contact angle ($\theta_T$) of the liquid (LQ) on the flat portion (F4) of the predetermined surface (Tc) is greater than 180 degrees.

According to the tenth aspect of the invention, inflow of a liquid to the back surface side of the substrate via the gap between the side surface of the substrate and the predetermined surface can be restrained even when a chamfered portion is present.

EFFECT OF THE INVENTION

According to the invention, inflow of a liquid to the back surface side of the substrate can be restrained, and occurrence of a problem due to inflow of a liquid can be prevented.

DESCRIPTION OF THE REFERENCE NUMERALS

1: base material, 2: coating, A: gap, A1: liquid-repellent area, A2: non-repellent area, C: chamfered portion, EX: exposure apparatus, LQ: liquid, P: substrate, Pa: upper surface (surface), Pb: lower surface (back surface), Pc: side surface, PH: substrate holder, PH1: first holder, PH2: second holder, T: plate member, Ta: upper surface (surface), Tb: lower surface (back surface), Tc: side surface

BEST MODE FOR CARRYING OUT THE INVENTION

Hereinafter, an embodiment of the invention will be described with reference to the drawings, however, the invention is not limited thereto.

Figure 1:
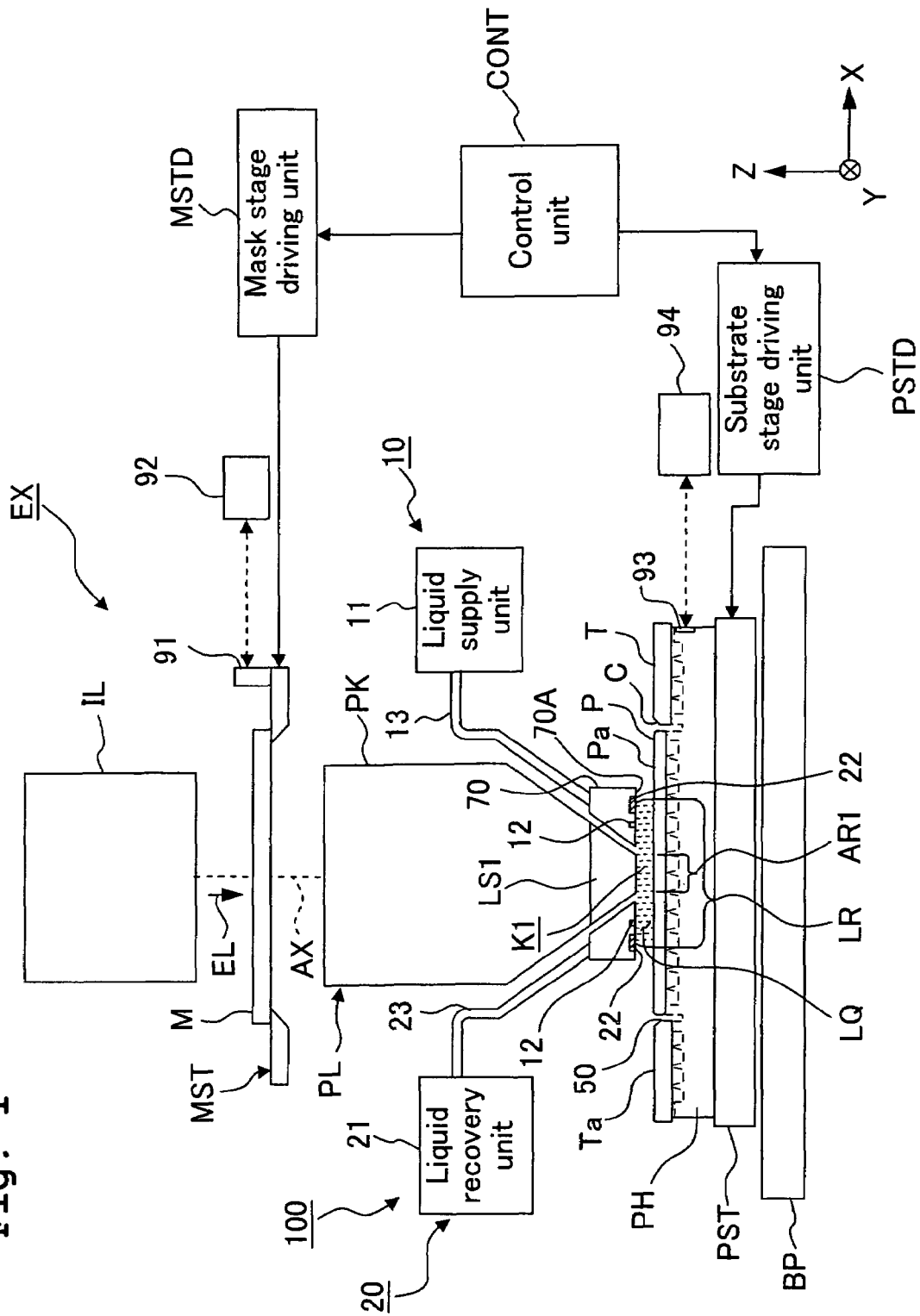
FIG. 1 is a schematic arrangement view showing an embodiment of an exposure apparatus.

An exposure apparatus according to this embodiment will be described with reference to FIG. 1. FIG. 1 is a schematic arrangement view showing an exposure apparatus EX. In FIG. 1, the exposure apparatus EX includes a mask stage MST which is movable while holding a mask M, a substrate holder PH which holds a substrate P, a substrate stage PST which can move the substrate holder PH holding the substrate P, an illumination optical system IL which illuminates the mask M held on the mask stage MST with an exposure light beam EL, a projection optical system PL which projects a pattern image on the mask M illuminated with the exposure light beam EL onto the substrate P, and a control unit CONT which controls the overall operations of the exposure apparatus EX.

The exposure apparatus EX of this embodiment is a liquid immersion exposure apparatus to which a liquid immersion method is applied for improving the resolution and substantially widening the depth of focus by substantially shortening the exposure wavelength, which includes a liquid immersion mechanism 100 for filling an optical path space K1 for an exposure light beam EL on the side of the image plane of the projection optical system PL with a liquid LQ. The liquid immersion mechanism 100 includes a nozzle member 70 which is provided in the vicinity of the side of the image plane of the projection optical system PL and has a supply port 12 which supplies a liquid LQ and a recovery port 22 which recovers the liquid LQ, a liquid supply mechanism 10 which supplies the liquid LQ to the side of the image plane of the projection optical system PL through the supply port 12 provided in the nozzle member 70, and a liquid recovery mechanism 20 which recovers the liquid LQ on the side of the image plane of the projection optical system PL through the recovery port 22 provided in the nozzle member 70. Above the substrate P (substrate holder PH), the nozzle member 70 is formed into an annular shape so as to surround a first optical element LS1 closest to the image plane of the projection optical system PL among a plurality of optical elements of the projection optical system PL.

At least while an image of a pattern on the mask M is projected onto the substrate P, the exposure apparatus EX adopts a local liquid immersion method in which on a part of the surface of the substrate P including the projection area AR of the projection optical system PL, a liquid immersion area LR of the liquid LQ supplied from the liquid supply mechanism 10, which is larger than the projection area AR and smaller than the substrate P, is locally formed. In detail, the exposure apparatus EX transfers an image of a pattern on the mask M onto the substrate P by filling an optical path space K1 for the exposure light beam EL between the first optical element LS1 closest to the image plane of the projection optical system PL and the substrate P held on the substrate holder PH and arranged on the side of the image plane of the projection optical system PL with the liquid LQ, and irradiating the substrate P with the exposure light beam EL that has passed through the mask M via the liquid LQ between the projection optical system PL and the substrate P and the projection optical system PL. The control unit CONT fills the optical path space K1 for the exposure light beam EL between the projection optical system PL and the substrate P with the liquid LQ by supplying a predetermined amount of the liquid LQ to the surface of the substrate P by the liquid supply mechanism 10 and recovering a predetermined amount of the liquid LQ from the surface of the substrate P by the liquid recovery mechanism 20 to locally form the liquid immersion area LR of the liquid LQ on the substrate P.

This embodiment will now be explained as exemplified by a case of use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the X axis direction is the synchronous movement direction (scanning direction) of the mask M and the substrate P in a horizontal plane, the Y axis direction (non-scanning direction) is the direction orthogonal to the X axis direction in the horizontal plane, and the Z axis direction is the direction which is perpendicular to the X axis direction and the Y axis direction and is coincident with the optical axis AX of the projection optical system PL. The directions of rotation (inclination) around the X axis, the Y axis, and the Z axis are defined as θX, θY, and θZ directions, respectively. The term "substrate" means a substrate (processing substrate) to be subjected to various processes including the exposure process, which includes a substrate entirely or partially coated with various protective coatings such as a photosensitive material (resist) or a protective coating (liquid-repellent coating) on a base material (having an upper surface, lower surface, and side surfaces) of a semiconductor wafer and the like, and the "mask" includes a reticle formed with a device pattern to be reduction-projected onto the substrate.

The illumination optical system IL includes an exposure light source, an optical integrator which uniformizes the illuminance of a light beam radiated from the exposure light source, a condenser lens which collects the exposure light beam EL from the optical integrator, a relay lens system, and a field diaphragm which sets an illumination area on the mask M to be illuminated with the exposure light beam EL. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, pure water is used as the liquid LQ. Pure water can transmit emission lines (g-ray, h-ray, i-ray) radiated, for example, from a mercury lamp and far ultraviolet light beams (DUV light beams) such as the KrF excimer laser beam (wavelength: 248 nm) as well as an ArF excimer laser beam.

The mask stage MST is movable while holding the mask M. The mask stage MST holds the mask M by vacuum adsorption (or electrostatic adsorption). The mask stage MST is two-dimensionally movable in a plane perpendicular to the optical axis AX of the projection optical system PL, that is, in an XY plane and slightly rotatable in the θZ direction while holding the mask M by driving of the mask stage driving unit MSTD including a linear motor and the like, to be controlled by the control unit CONT. On the mask stage MST, a movement mirror 91 is fixedly provided. On a position facing the movement mirror 91, a laser interferometer 92 is provided. The two-dimensional position and the angle of rotation in the θZ direction (including the angles of rotation in θX and θY directions according to circumstances) of the mask M on the mask stage MST are measured by the laser interferometer 92 in real time. The result of measurement by the laser interferometer 92 is outputted to the control unit CONT. The control unit CONT drives the mask stage driving unit MSTD based on the result of measurement made by the laser interferometer 92 and controls the position of the mask M held on the mask stage MST.

The projection optical system PL projects the image of the pattern on the mask M to the substrate P at a predetermined projection magnification β. The projection optical system PL includes a plurality of optical elements, and these optical elements are held by a barrel PK. In this embodiment, the projection optical system PL is the reduction system having the projection magnification β which is, for example, ¼, ⅕, or ⅛. The projection optical system PL may be any one of either the same magnification system or the enlarging system. The projection optical system PL may be any one of a refractive system including no reflecting element, a reflective system including no refracting element, and a catadioptric system including a reflecting element and a refracting element. In this embodiment, the first optical element LS1 closest to the image plane of the projection optical system PL among the plurality of optical elements of the projection optical system PL is exposed from the barrel PK.

The substrate stage PST is movable on the base member BP on the side of the image plane of the projection optical system PL while supporting the substrate holder PH holding the substrate P. The substrate stage PST is two-dimensionally movable in an XY plane and slightly rotatable in the θZ direction on the base member BP according to the driving of a substrate stage driving unit PSTD including a linear motor and the like, to be controlled by the control unit CONT. The substrate stage PST is also movable in the Z-axis direction, the θX direction, and the θY direction. Therefore, the substrate holder PH on the substrate stage PST and the upper surface (surface) Pa of the substrate P held on the substrate holder PH are movable in the six free directions of the X axis, Y axis, Z axis, θX, θY, and θZ directions. On a side surface of the substrate holder PH, a movement mirror 93 is fixedly provided. At a position facing the movement mirror 93, a laser interferometer 94 is provided. The two-dimensional position and the angle of rotation of the substrate P on the substrate holder PH are measured in real time by the laser interferometer 94. The exposure apparatus EX includes a focus leveling detection system (not shown) based on the oblique incidence system which detects surface positional information on the upper surface Pa of the substrate P. The focus leveling detection system detects surface positional information (positional information on the Z axis direction and inclination information on the θX and θY directions) of the upper surface Pa of the substrate P. The focus leveling detection system may adopt a method using a capacitance type sensor. The result of measurement made by the laser interferometer 94 is outputted to the control unit CONT. The result of detection made by the focus leveling detection system is also outputted to the control unit CONT. The control unit CONT matches the surface of the substrate P with the image plane of the projection optical system PL by driving the substrate stage driving unit PSTD based on the result of detection by the focus leveling detection system and controlling the focus position (Z position) and angles of inclination (θX and θY) of the substrate P, and performs a positional control in the X axis direction, Y axis direction, and θZ direction of the substrate P based on the result of measurement made by the laser interferometer 94.

Next, the liquid supply mechanism 10 and the liquid recovery mechanism 20 of the liquid immersion mechanism 100 will be described. The liquid supply mechanism 10 supplies the liquid LQ to the side of the image plane of the projection optical system PL. The liquid supply mechanism 10 includes a liquid supply unit 11 that can feed the liquid LQ and a supply tube 13 of which one end is connected to the liquid supply unit 11. The other end of the supply tube 13 is connected to the nozzle member 70. Inside the nozzle member 70, an internal flow channel (supply flow channel) connecting the other end of the supply tube 13 and supply ports 12 is formed. The liquid supply unit 11 includes a tank for accommodating the liquid LQ, a pressurizing pump, a temperature adjusting mechanism for adjusting the temperature of the liquid LQ to be supplied and a filter unit which removes foreign bodies in the liquid LQ. The liquid supply operation of the liquid supply unit 11 is controlled by the control unit CONT. The exposure apparatus EX is not necessarily required to include all the tank, pressurizing pump, a temperature adjusting mechanism, and a filter unit of the liquid supply mechanism 10 and the like, and the facilities of a factory in which the exposure apparatus EX is installed can be used instead.

The liquid recovery mechanism 20 recovers the liquid LQ on the side of the image plane of the projection optical system PL. The liquid recovery mechanism 20 includes a liquid recovery unit 21 capable of recovering the liquid LQ and a recovery tube 23 of which one end is connected to the liquid recovery unit 21. The other end of the recovery tube 23 is connected to the nozzle member 70. Inside the nozzle member 70, an internal flow channel (recovery flow channel) which connects the other end of the recovery tube 23 and the recovery ports 22 is formed. The liquid recovery unit 21 includes a vacuum system (suction unit) such as a vacuum pump, a gas-liquid separator which separates the recovered liquid LQ from gases, and a tank which accommodates the recovered liquid LQ. The exposure apparatus EX is not necessarily required to include all the vacuum system, the gas-liquid separator, and the tank and the like, of the liquid recovery mechanism 20, and facilities of a factory in which the exposure apparatus EX is installed can be used instead.

The supply ports 12 which supplies the liquid LQ and the recovery ports 22 which recovers the liquid LQ are formed in the lower surface 70A of the nozzle member 70. The lower surface 70A of the nozzle member 70 is provided at a position facing the upper surface Pa of the substrate P (upper surface Ta of the plate member T). The nozzle member 70 is an annular member provided so as to surround the side surface of the first optical element LS1, and a plurality of supply ports 12 are provided so as to surround the first optical element LS1 of the projection optical system PL (the optical axis AX of the projection optical system PL) in the lower surface 70A of the nozzle member 70. The recovery ports 22 are provided further outward than the supply ports 12 from the first optical element LS1 so as to surround the first optical element LS1 and the supply ports 12.

When forming the liquid immersion area LR of the liquid LQ, the control unit CONT drives the liquid supply unit 11 and the liquid recovery unit 21, respectively. When the liquid LQ is fed from the liquid supply unit 11 under control of the control unit CONT, the liquid LQ fed from the liquid supply unit 11 flows through the supply tube 13 and then is supplied to the side of the image plane of the projection optical system PL from the supply ports 12 via the supply flow channel of the nozzle member 70. When the liquid recovery unit 21 is driven under control of the control unit CONT, the liquid LQ on the side of the image plane of the projection optical system PL flows into the recovery flow channel of the nozzle member 70 through the recovery ports 22 and flows through the recovery tube 23, and is then recovered by the liquid recovery unit 21.

When performing a liquid immersion exposure of the substrate P, the control unit CONT fills the optical path space K1 for the exposure light beam EL between the projection optical system PL and the substrate P held on the substrate holder PH with the liquid LQ by the liquid immersion mechanism 100, and exposes the substrate P by irradiating the surface of the substrate P with the exposure light beam EL via the projection optical system PL and the liquid LQ.

Figure 2:
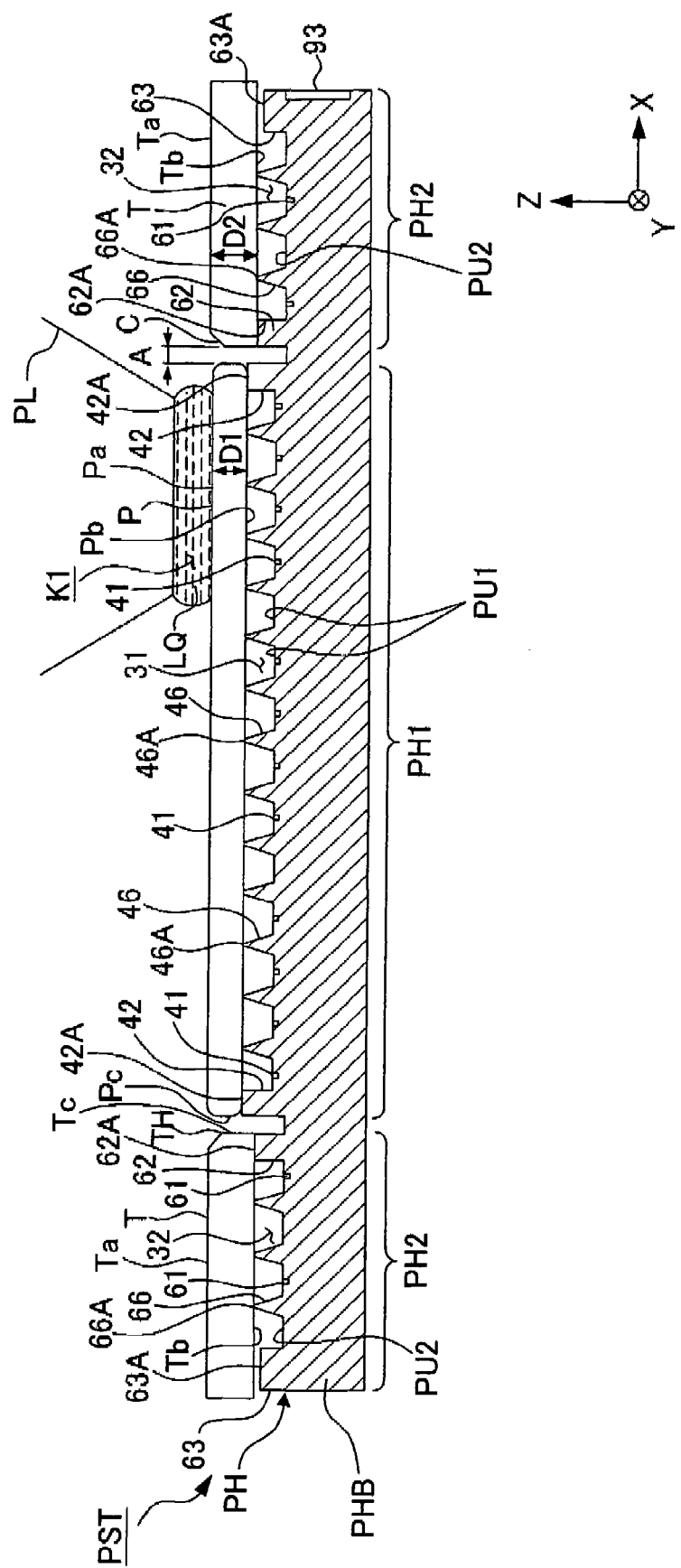
FIG. 2 is a side sectional view showing a substrate holder.

Next, the substrate holder PH will be described with reference to FIG. 2. FIG. 2 is a side sectional view of the substrate holder PH. The substrate holder PH includes a base material PHB, a first holder PH1 that is formed on the base material PHB and holds the substrate P and a second holder PH2 that is formed on the base material PHB and holds the plate member T so as to surround the substrate P held on the first holder PH1. The plate member T is separate from the base material PHB, and provided to be detachable (exchangeable) from the second holder PH2. In this embodiment, the substrate P is in a substantially circular shape in a plan view. The plate member T is a substantially annular member, and at the central portion thereof, a hole TH in a substantially circular shape in which the substrate P can be arranged is formed. The inner surface (side surface on the inner side) Tc of the plate member T held on the second holder PH2 is arranged so as to surround the side surface Pc of the substrate P held on the first holder PH1. The upper portion of the inner surface Tc of the plate member T is chamfered, and a chamfered portion C is formed on the upper portion of the inner surface Tc. Various members made of materials such as metals are chamfered on their edges in many cases of machining. In this embodiment, the plate member T to be arranged around the substrate P is also chamfered, and by chamfering the upper portion of the inner surface Tc of the plate member T, burrs can be prevented from being formed on the edge, and production of foreign bodies is prevented. However, as described later, the plate member T comes into contact with the liquid in the liquid immersion area, so that the chamfered portion C formed on the plate member T may influence the behaviors of the liquid. In particular, due to the chamfered portion C formed on the plate member T, the gap A between the plate member T and the substrate P may be widened or the shape of the interface of the liquid LQ at the plate member T and the substrate P easily becomes convex toward the +Z direction. As a result, the liquid easily makes inflow into the gap A, and furthermore, it may reach the back surface of the substrate P via the gap A. The inventor of the present invention analyzed this situation and found that the positional relationship between a chamfered portion C and a liquid-repellent area on the side surface of the substrate become important when the chamfered portion C is formed on the plate member T.

The first holder PH1 of the substrate holder PH includes first supporting portions 46 in convex shapes formed on a first upper surface PU1 of the base material PHB, a first peripheral wall 42 in an annular shape formed on the base material PHB so as to surround the first supporting portions 46, and first suction ports 41 provided on the first upper surface PU1 of the base material PHB on the inner side of the first peripheral wall 42. The first supporting portions 46 support the lower surface (back surface) Pb of the substrate P, and are uniformly formed on the inner side of the first peripheral wall 42. The first supporting portions 46 include a plurality of support pins. The first peripheral wall 42 is formed into a substantially annular shape corresponding to the outer form of the substrate P. The upper surface 42A of the first peripheral wall 42 is provided so as to face the peripheral area (edge area) of the lower surface Pb of the substrate P held on the first holder PH1. The upper surface 42A of the first peripheral wall 42 is flat. In this embodiment, the upper surfaces 46A of the first supporting portions 46 are formed at the same height as or slightly higher than the upper surface 42A of the first peripheral wall 42. On the side of the lower surface Pb of the substrate P held on the first holder PH1, a first space 31 surrounded by the substrate P, the first peripheral wall 42, and the first upper surface PU1 of the base material PHB is formed.

The first suction ports 41 are for suction-holding the substrate P, and are provided at a plurality of predetermined positions of the first upper surface PU1 (except for the first supporting portions 46) of the base material PHB on the inner side of the first peripheral wall 42. In this embodiment, the first suction ports 41 are uniformly arranged on the first upper surface PU1 on the inner side of the first peripheral wall 42.

Each of the first suction ports 41 is connected to a vacuum system (not shown) via a flow channel. The vacuum system includes a vacuum pump for making negative pressure in the first space 31 surrounded by the substrate P, the first peripheral wall 42, and the base material PHB. As described above, the first supporting portions 46 include support pins, and the first holder PH1 in this embodiment forms a so-called pin-chuck mechanism. The control unit CONT adsorbs and holds the substrate P by the first holder PH1 by suctioning gases (air) in the first space 31 surrounded by the substrate P, the first peripheral wall 42, and the first upper surface PU1 of the base material PHB by driving the vacuum system to make the pressure in the first space 31 negative.

The second holder PH2 of the substrate holder PH includes a second peripheral wall 62 in substantially an annular shape formed on the base material PHB so as to surround the first peripheral wall 42, a third peripheral wall 63 that is provided on the outer side of the second peripheral wall 62 and is in substantially an annular shape formed on the base material PHB so as to surround the second peripheral wall 62, second supporting portions 66 in convex shapes formed on the base material PHB between the second peripheral wall 62 and the third peripheral wall 63, and second suction ports 61 provided on the second upper surface PU2 of the base material PHB between the second peripheral wall 62 and the third peripheral wall 63. The second supporting portions 66 support the lower surface (back surface) Tb of the plate member T, and are uniformly formed between the second peripheral wall 62 and the third peripheral wall 63. In this embodiment, the second supporting portions 66 also include a plurality of support pins similar to the first supporting portions 46. The third peripheral wall 63 is provided outside the second peripheral wall 62 with respect to the first space 31. The second peripheral wall 62 is formed in substantially an annular shape corresponding to the shape of the hole TH in the plate member T. On the other hand, the third peripheral wall 63 is formed in a substantially rectangular annular shape corresponding to the outer form of the plate member T. The upper surface 62A of the second peripheral wall 62 is formed so as to face an inner edge area (edge area on the inner side) in the vicinity of the hole PH of the lower surface Tb of the plate member T held on the second holder PH2. The upper surface 63A of the third peripheral wall 63 is formed so as to face an outer edge area (edge area on the outer side) of the lower surface Tb of the plate member T held on the second holder PH2. On the side of the lower surface Tb of the plate member T held on the second holder PH2, a second space 32 surrounded by the second upper surface PU2 of the base material PHB, the second and third peripheral walls 62 and 63, and the lower surface Tb of the plate member T is formed.

On the second upper surface PU2 of the base material PHB between the second peripheral wall 62 and the third peripheral wall 63, second suction ports 61 are formed. The second suction ports 61 are for adsorbing and holding the plate member T, and are provided at a plurality of predetermined positions except for the second supporting portions 66 on the upper surface of the base material PHB between the second peripheral wall 62 and the third peripheral wall 63. In this embodiment, a plurality of second suction ports 61 is uniformly arranged on the second upper surface PU2 between the second peripheral wall 62 and the third peripheral wall 63.

Each of the second suction ports 61 is connected to a vacuum system (not shown) via a flow channel. The vacuum system includes a vacuum pump for making negative the pressure in the second space 32 surrounded by the base material PHB, the second and third peripheral walls 62 and 63, and the lower surface Tb of the plate member T. As described above, the second supporting portions 66 include support pins, and the second holder PH2 in this embodiment also forms a so-called pin-chuck mechanism similar to the first holder PH1. The second and third peripheral walls 62 and 63 function as outer walls surrounding the outside of the second space 32 including the second supporting portions 66, and the control unit CONT adsorbs and holds the plate member T by the second supporting portions 66 by making negative pressure in the second space 32 by suctioning gases (air) inside the second space 32 surrounded by the base material PHB, the second and third peripheral walls 62 and 63, and the plate member T by driving the vacuum system.

The side surface Pc of the substrate P held on the first holder PH1 and the inner surface Tc of the plate member T held on the second holder PH2 face each other, and between the side surface Pc of the substrate P and the inner surface Tc of the plate member T, a predetermined gap A is formed.

The upper surface (surface) Ta and the lower surface Tb of the plate member T are flat surfaces. The thickness D2 of the plate member T is set greater than the thickness D1 of the substrate P. In this embodiment, the substrate holder PH holds the substrate P and the plate member T by the first holder PH1 and the second holder PH2, respectively, so that the lower surface Pb of the substrate P becomes higher in position (position on the +Z side) than the lower surface Tb of the plate member T. In this embodiment, the upper surface Pa of the substrate P held on the first holder PH1 and the upper surface Ta of the plate member T held on the second holder PH2 are provided so as to become substantially flush with each other.

The upper surface Ta, the lower surface Tb, and the inner surface Tc of the plate member T are repellent to the liquid LQ. In this embodiment, the plate member T is made of a metal such as stainless steel, and a liquid-repellent material that is repellent to the liquid LQ is coated on the respective upper surface Ta, lower surface Tb, and inner surface Tc of the plate member T made of metal. As the liquid-repellent material, a fluorine-based resin material such as polyethylene tetrafluoride or an acrylic resin material is used. Alternatively, the plate member T can be coated with "Cytop" made by Asahi Glass Co., Ltd. For making the plate member T liquid-repellent, the plate member T itself may be made of a liquid-repellent material such as a fluorine-based resin material.

Therefore, the inner surface Tc of the plate member T that is liquid-repellent faces the side surface Pc of the substrate P held on the first holder PH1 via a predetermined gap.

By arranging a plate member T around the substrate P, also in the case where the liquid immersion area LR of the liquid LQ is formed across the upper surface Pa of the substrate P and the upper surface Ta of the plate member T or the liquid immersion area LR is moved between the upper surface Pa of the substrate P and the upper surface Ta of the plate member T when exposing, for example, a peripheral area of the upper surface Pa of the substrate P, the liquid immersion area LR can be satisfactorily held and the optical path space K1 on the side of the image plane of the projection optical system PL can be continuously filled with the liquid LQ.

Figure 3:
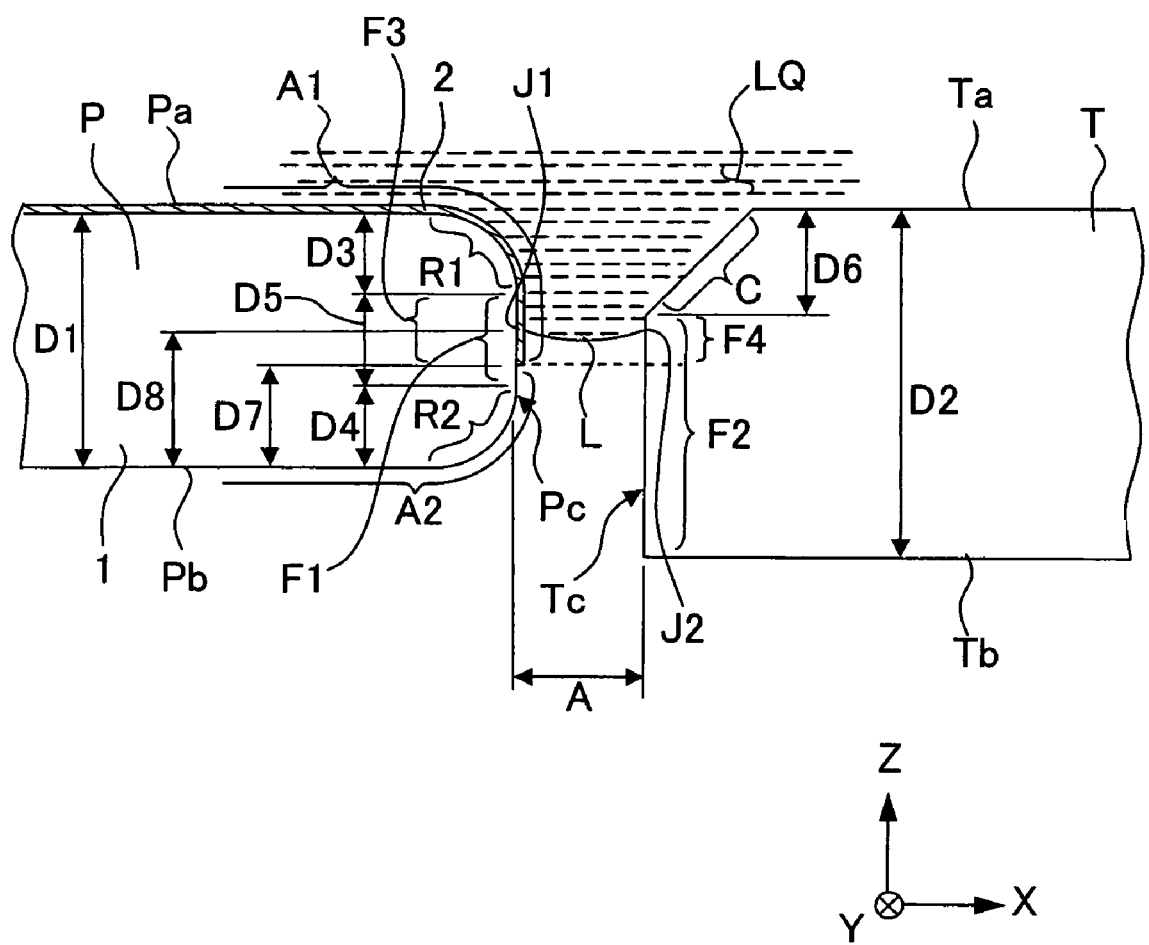
FIG. 3 is an enlarged view showing the vicinity of a side surface of a substrate and an inner surface of a plate member.

FIG. 3 is a drawing showing an example of the side surface Pc of the substrate P and the inner surface Tc of the plate member T. As described above, the lower surface Pb of the substrate P held on the first holder PH1 is provided at a position higher than the lower surface Tb of the plate member T held on the second holder PH2, and the thickness D2 of the plate member T is set greater than the thickness D1 of the substrate P. The upper surface Pa of the substrate P held on the first holder PH1 and the upper surface Ta of the plate member T held on the second holder PH2 are substantially flush with each other. In this embodiment, the thickness D1 of the substrate P is approximately 0.775 mm.

In this embodiment, the areas including the upper portion and the lower portion, respectively, of the side surface Pc of the substrate P are curved surfaces (arced shapes) in a sectional view. In the following description, the curved area of the upper portion of the side surface Pc of the substrate P will be referred to as "upper arced portion R1" as appropriate, and the curved area of the lower portion will be referred to as "lower arced portion R2" as appropriate. The sectional shape of the area F1 other than the arced portions R1 and R2 of the side surface Pc of the substrate P held on the first holder PH1 is plane (flat), and is provided substantially parallel to the vertical direction (Z axis direction). In the following description, the area other than the arced portions R1 and R2 of the side surface Pc of the substrate P will be referred to as "first flat portion F1" as appropriate.

On the upper portion of the inner surface Tc of the plate member T held on the second holder PH2, a chamfered portion C is provided. The sectional shape of the region F2 other than the chamfered portion C of the inner surface Tc of the plate member T is plane (flat), and is provided substantially parallel to the vertical direction (Z axis direction). In the following description, the area other than the chamfered portion C of the inner surface Tc of the plate member T will be referred to as "second flat portion F2" as appropriate.

The first flat portion F1 of the side surface Pc of the substrate P and the second flat portion F2 of the inner surface Tc of the plate member T are respectively provided substantially parallel to the Z axis direction, so that the first flat portion F1 of the substrate P held on the first holder PH1 and the second flat portion F2 of the plate member T held on the second holder PH2 are substantially parallel to each other.

In this embodiment, the sizes D3 and D4 of the arced portions R1 and R2 in the Z axis direction are approximately 0.25 mm, respectively. The size D3 of the upper arced portion R1 means the distance in the Z axis direction between the position of the upper surface Pa of the substrate P and the lower end position of the upper arced portion R1. The size D4 of the lower arced portion R2 means the distance in the Z axis direction between the position of the lower surface Pb of the substrate P and the upper end position of the lower arced portion R2. The thickness D1 of the substrate P is approximately 0.775 mm, and the sizes D3 and D4 of the arced portions R1 and R2 are approximately 0.25 mm, respectively, so that the size D5 in the Z axis direction of the first flat portion F1 becomes approximately 0.275 mm.

In this embodiment, the chamfering angle of the chamfered portion C of the plate member T is approximately 45 degrees. Namely, the chamfered portion C is defined by a flat surface having an angle of 45 degrees with respect to the upper surface Ta of the plate member T. The depth D6 (size in the Z axis direction) of the chamfered portion C is set to not more than 0.5 mm. The chamfered portion C provided at the upper portion of the inner surface Tc of the plate member T is provided continuously to the upper surface Ta of the plate member T (extends so as to reach the upper surface Ta of the plate member T). The chamfered portion C provided on the inner surface Tc and the upper surface Ta are liquid-repellent, and the upper surface Ta of the plate member T is substantially flush with the upper surface Pa of the substrate P held on the first holder PH1 as described above. Therefore, the substrate holder PH has a liquid-repellent upper surface Ta provided continuously to the chamfered portion C on the upper portion of the inner surface Tc so as to become substantially flush with the upper surface Pa of the substrate P held on the first holder PH1.

As described above, the inner surface Tc that is liquid-repellent of the plate member T is provided so as to face the side surface Pc of the substrate P via the gap A. The gap A is the distance between the first flat portion F1 of the side surface Pc of the substrate P and the second flat portion F2 of the inner surface Tc of the plate member T. In this embodiment, the gap A is set to approximately 0.1 to 0.5 mm.

On a part of the upper surface Pa and the side surface Pc of the substrate P, an area A1 that is repellent to the liquid LQ is provided. In the following description, the liquid-repellent area provided at a part of the upper surface Pa and the side surface Pc of the substrate P will be referred to as "liquid-repellent area A1" as appropriate. The liquid-repellent area A1 on the upper surface Pa and the side surface Pc of the substrate P is an area coated with a liquid-repellent material on the base material 1 of the substrate P. The substrate P is coated with a photosensitive material (resist) on the upper surface of the base material 1 of a semiconductor wafer (silicon wafer) and the like, and in this embodiment, a coating 2 that is further coated on the photosensitive material coated on the upper surface of the substrate 1 is provided. The photosensitive material is not shown in FIG. 3. The coating 2 functions as a protective coating (topcoat) for protecting the photosensitive material, and is provided so as to have a substantially uniform thickness (approximately 200 nm) continuously on the upper surface Pa of the substrate P (base material 1) and the side surface Pc including the upper arced portion R1. The material forming this coating 2 is repellent to the liquid LQ, and by coating this liquid-repellent material on the base material 1 of the substrate P, the liquid-repellent area A1 is provided on the upper surface Pa and the side surface Pc of the substrate P, respectively. In this embodiment, as the material (liquid-repellent material) forming the coating 2, "TSP-3A" made by Tokyo Ohka Kogyo Co., Ltd. is used. The upper surface Pa of the substrate P (base material 1) may not be liquid-repellent. Namely, the upper surface Pa of the substrate P (base material 1) may not be included in the liquid-repellent area A1.

The liquid-repellent area A1 (coating 2) is also formed on a part of the side surface Pc of the substrate P (base material 1). In the example shown in FIG. 3, the liquid-repellent area A1 is provided on the whole of the upper arced portion R1 and a part of the first flat portion F1. The distance D7 between the position of the lower surface Pb of the substrate P and the lower end position of the liquid-repellent area A1 is set as a predetermined value. The area A2 other than the liquid-repellent area A1 of the side surface Pc of the substrate P is not coated with the coating 2, and the base material 1 is exposed to the area A2. The lower surface Pb of the substrate P is not coated with the coating 2, either. In the following description, the area other than the liquid-repellent area A1 of the side surface Pc of the substrate P and the lower surface Pb will be referred to as "non-repellent area A2" as appropriate.

By providing the non-repellent area A2, for example, contamination of a transporting unit that transports the substrate P while holding the lower surface Pb of the substrate P can be prevented. The non-repellent area A2 is formed by removing (rinsing) the coating 2 after coating this coating 2 on the side surface Pc of the substrate P. Namely, by adjusting the position for removing (rinsing) the coating 2, the distance D7 can be set to a desired value.

In the example of FIG. 2, on the first flat portion F1 of the side surface Pc of the substrate P, the liquid-repellent area A1 and the non-repellent area A2 are provided. In the following description, the liquid-repellent area A1 of the first flat portion F1 of the side surface Pc of the substrate P will be referred to as "first liquid-repellent flat portion F3" as appropriate.

The chamfered portion C of the plate member T is provided so as to face the liquid-repellent area A1 (coating 2) of the substrate P held on the first holder PH1. Namely, as described above, by forming the chamfered portion C on the plate member T, the liquid easily makes inflow into the gap A between the plate member T and the substrate P and reaches the back surface of the substrate P. In order to prevent this, in the invention, the chamfered portion C of the plate member T and the liquid-repellent area A1 of the substrate P held on the first holder PH1 face each other. In particular, according to analysis by the inventor, it was found that the liquid was more efficiently prevented from reaching the back surface of the substrate P by adjusting the positional relationship between the liquid-repellent area A1 of the substrate P and the chamfered portion C facing the liquid-repellent area to a predetermined relationship. Therefore, the depth D6 of the chamfered portion C is set according to the liquid-repellent area A1 on the side surface Pc of the substrate P as described later. In detail, as shown in FIG. 3, the depth D6 of the chamfered portion C is set so that the lower end of the chamfered portion C of the plate member T held on the second holder PH2 becomes higher in position (position on the +Z side) than the lower end of the liquid-repellent area A1 of the side surface Pc of the substrate P held on the first holder PH1. Therefore, on a part of the second flat portion F2 of the inner surface Tc of the plate member T, an area F4 facing the first liquid-repellent flat portion F3 of the side surface Pc of the substrate P is provided. In the following description, the area of the second flat portion F2 of the inner surface Tc of the plate member T, facing the first liquid-repellent flat portion F3 of the side surface Pc of the substrate P, will be referred to as "second liquid-repellent flat portion F4" as appropriate.

The sum of the contact angle $\theta_P$ of the liquid-repellent area A1 of the side surface Pc of the substrate P with the liquid LQ and the contact angle $\theta_T$ of the inner surface Tc of the plate member T with the liquid LQ is greater than 180 degrees. Namely, when an interface L of the liquid LQ is present between the first liquid-repellent flat portion F3 and the second liquid-repellent flat portion F4 that are substantially parallel, the sum of the contact angle $\theta_P$ of the liquid LQ at an intersection J1 between the side surface Pc of the substrate P and the interface L of the liquid LQ and the contact angle $\theta_T$ of the liquid LQ at the intersection J2 between the inner surface Tc of the plate member T and the interface L of the liquid LQ is greater than 180 degrees. When the sum of the contact angle $\theta_P$ and the contact angle $\theta_T$ is greater than 180 degrees, the shape of the interface of the liquid LQ between the plate member T and the substrate P becomes convex downward (toward the −Z direction), and based on the Laplace Law, the surface tension of the liquid LQ and the interface of the liquid LQ become difficult to move downward. Therefore, it is known that, unless a considerable pressure is applied to the liquid LQ, the liquid that has made inflow through the gap between the substrate P and the plate member T does not flow downward (to the back surface side of the substrate) due to the surface tension of the liquid LQ. Therefore, desirably, the contact angle $\theta_P$ of the liquid-repellent area A1 of the substrate P with the liquid LQ is more than 90 degrees, and the contact angle $\theta_T$ of the inner surface Tc of the plate member T with the liquid LQ is also desirably more than 90 degrees. In this embodiment, the contact angle $\theta_P$ of the liquid-repellent area A1 of the substrate P with the liquid LQ is approximately 110 degrees, and the contact angle $\theta_T$ of the inner surface Tc of the plate member T with the liquid LQ is also approximately 110 degrees. Namely, in this embodiment, the sum of the contact angle $\theta_P$ of the liquid-repellent area A1 of the side surface Pc of the substrate P with the liquid LQ and the contact angle $\theta_T$ of the inner surface Tc of the plate member T with the liquid LQ is approximately 220 degrees. The Laplace Law is described in, for example, "Physics of Surface Tension" (published by Yoshioka Shoten), pp. 6-9.

Then, by setting the depth D6 of the chamfered portion C according to the liquid-repellent area A1 of the substrate P and providing the second liquid-repellent flat portion F4, as shown in FIG. 3, the shape of the interface L between the liquid LQ and the gases outside (below) the liquid LQ between the substrate P and the plate member T can be maintained in the downward convex shape (convex toward the −Z direction), and inflow of the liquid LQ into the lower surface Pb side of the substrate P via the gap A can be restrained.

Figure 4:
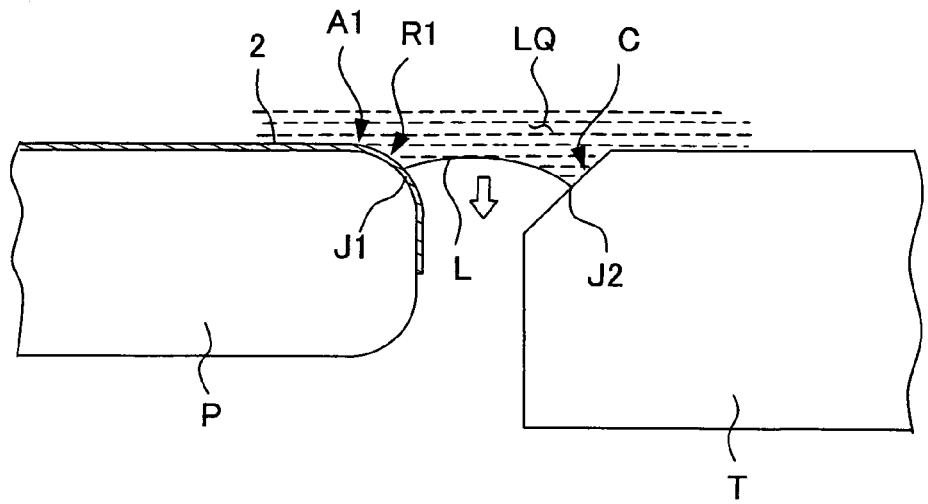
FIGS. 4A to 4C are schematic views showing behaviors of a liquid, respectively.
Figure 4:
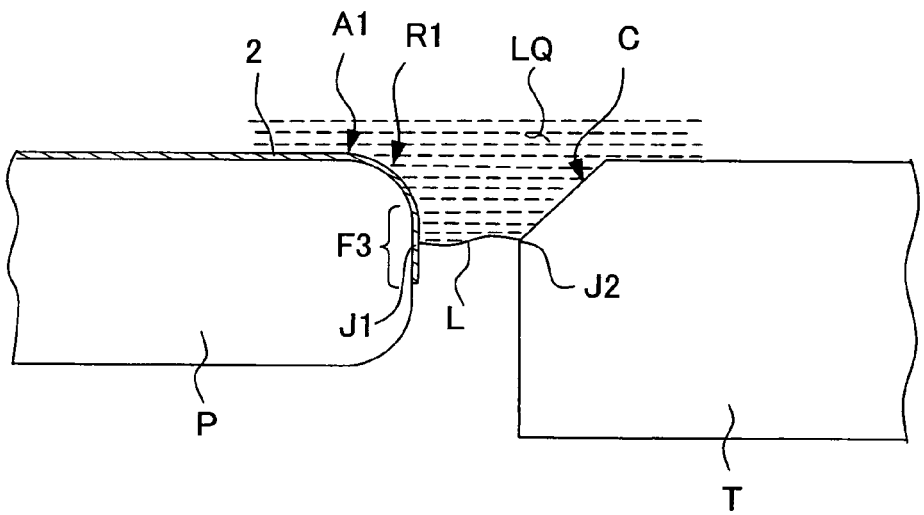
Figure 4:
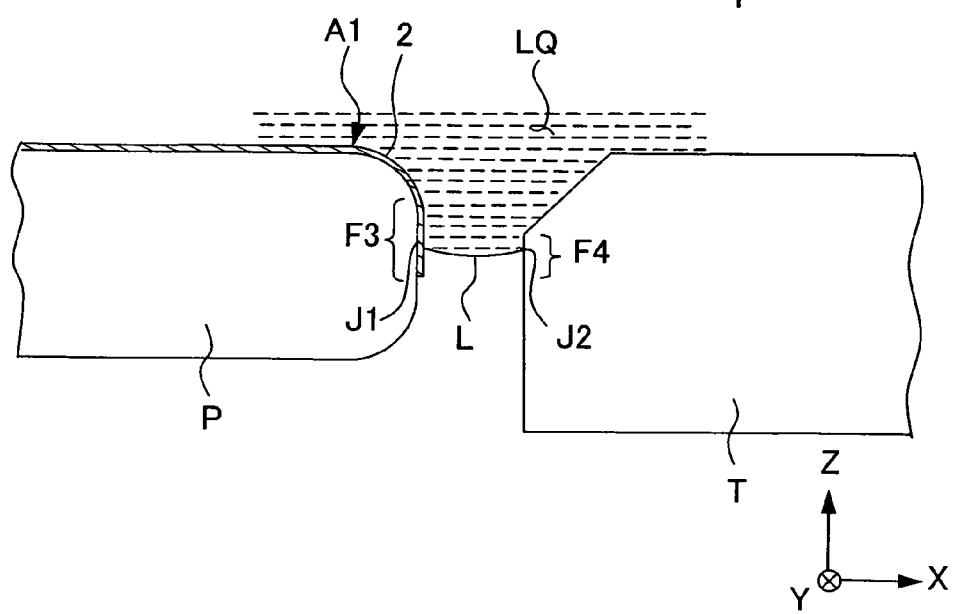

FIGS. 4(A) to 4(C) are drawings schematically showing states that the liquid LQ is at various positions between the substrate P and the plate member T. As shown in FIG. 4(A), in a state that the liquid is present on the chamfered portion C, that is, when the intersection J1 between the interface L of the liquid LQ and the substrate P is positioned on the upper arced portion R1 and the intersection J2 between the interface L and the plate member T is positioned on the chamfered portion C, the shape of the interface L becomes convex upward. Also, in a case where the contact angle $\theta_P$ between the liquid LQ and the upper arced portion R1 is 110 degrees and the contact angle $\theta_T$ between the liquid LQ and the chamfered portion C is 110 degrees, the upper arced portion R1 and the chamfered portion C are inclined with respect to the Z axis direction, and the gap between the upper arced portion R1 and the chamfered portion C is in a tapered shape that gradually narrows downward, so that the shape of the interface L becomes convex upward. Thus, even when the substrate P and the plate member T are respectively liquid-repellent, the shape of the interface L becomes convex upward according to the shapes of the substrate P and the plate member T in some cases. When the shape of the interface L is convex upward, a downward (−Z direction) force acts on the liquid LQ according to the surface tension of the liquid LQ, and the interface L (liquid LQ) moves downward between the surface P and the plate member T by capillarity. When the interface L (liquid LQ) moves downward between the substrate P and the plate member T from the state of FIG. 4(A), this results in the situation of FIG. 4(B).

As shown in FIG. 4(B), even in the situation that the liquid LQ reaches the lower end of the chamfered portion C, that is, the intersection J1 between the interface L and the substrate P is positioned on the first liquid-repellent flat portion F3 and the intersection J2 between the interface L and the plate member T is positioned on the lower end of the chamfered portion C, there is a high possibility that the shape of the interface L does not become convex downward. Therefore, also in this case, there is a high possibility that the interface L moves downward between the substrate P and the plate member T. Further downward movement (of the liquid LQ) between the substrate P and the plate member T from the situation of FIG. 4(B) will result in the situation of FIG. 4(C).

As shown in FIG. 4(C), when the intersection J1 between the interface L and the substrate P is positioned on the first liquid-repellent flat portion F3 and the intersection J2 between the interface L and the plate member T is positioned on the second liquid-repellent flat portion F4, the contact angle $\theta_P$ between the liquid LQ and the first liquid-repellent flat portion F3 is 110 degrees, the contact angle $\theta_T$ between the liquid LQ and the second liquid-repellent flat portion F4 is 110 degrees, and the first liquid-repellent flat portion F3 and the second liquid-repellent flat portion F4 are parallel to each other, so that the shape of the interface L becomes convex downward. In this case, an upward force acts on the liquid LQ according to the surface tension of the liquid LQ, so that the interface L is prevented from moving downward between the substrate P and the plate member T.

Thus, by setting the depth D6 of the chamfered portion C to be small to a degree which allows provision of the second liquid-repellent flat portion F4, even when the liquid LQ (interface L) in the liquid immersion area LR formed above the gap A moves downward between the substrate P and the plate member T, the downward movement of the interface L can be stopped between the first liquid-repellent flat portion F3 and the second liquid-repellent flat portion F4.

Figure 5:
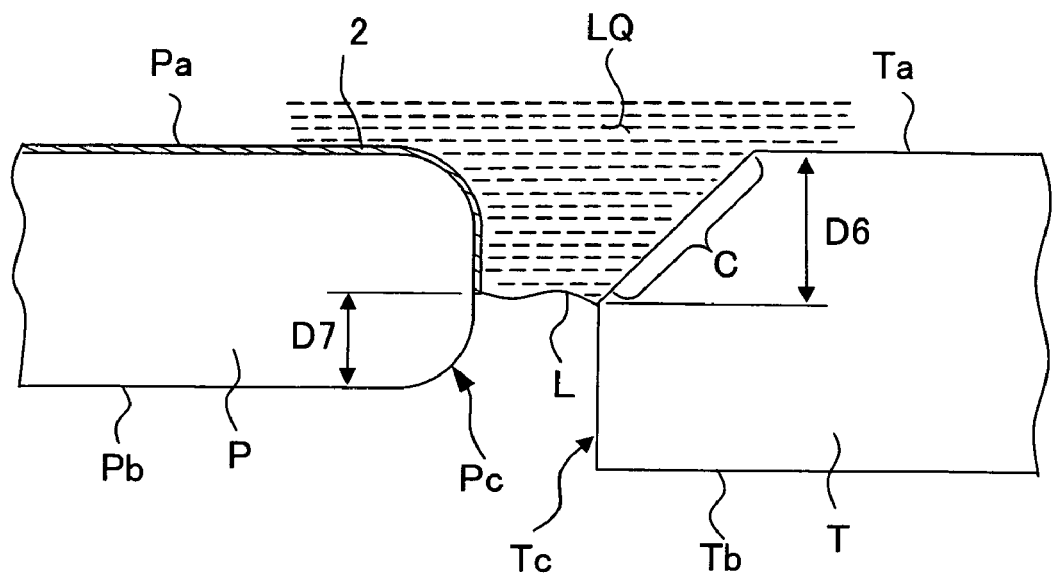
FIGS. 5A and 5B are schematic views showing behaviors of the liquid, respectively.
Figure 5:
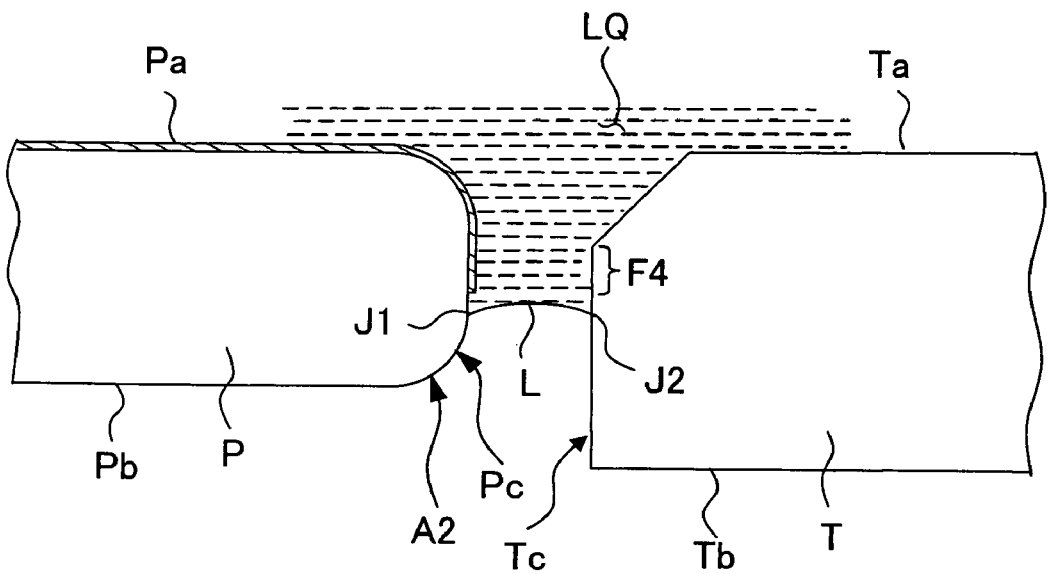

For example, as shown in FIG. 5(A), when a situation arises that the liquid-repellent area A1 of the side surface Pc of the substrate P and an area as a part of the chamfered portion C of the inner surface Tc of the plate member T do not face each other, in other words, when the depth D6 of the chamfered portion C is increased to a degree which does not allow provision of the second liquid-repellent flat portion F4, the area that stops the downward movement of the interface L disappears, so that the liquid LQ is more likely to make inflow into the lower surface Pb side of the substrate P via the gap A.

Even when the second liquid-repellent flat portion F4 is provided as shown in FIG. 5(B), if the pressure Pf of the liquid LQ in the liquid immersion area LR formed above the gap between the substrate P and the plate member T increases and the interface L moves toward the −Z direction and the intersection J1 between the interface L and the substrate P reaches the non-repellent area A2, the base material 1 of the substrate P is lyophilic (for example, the contact angle with the liquid LQ is approximately 10 degrees), so that the shape of the interface L becomes convex upward, the interface L moves downward between the substrate P and the plate member T, and the liquid LQ is more likely to make inflow into the lower surface Pb side of the substrate P. Therefore, it is desirable that the operations for supplying and recovering the liquid LQ by the liquid immersion mechanism 100 are performed so that the pressure Pf becomes smaller than the pressure Ps caused by the surface tension of the liquid LQ between the substrate P and the plate member T. Herein, the pressure Pf includes a pressure caused by the flow of the liquid LQ and the weight (gravitational pressure) of the liquid LQ itself.

Figure 6:
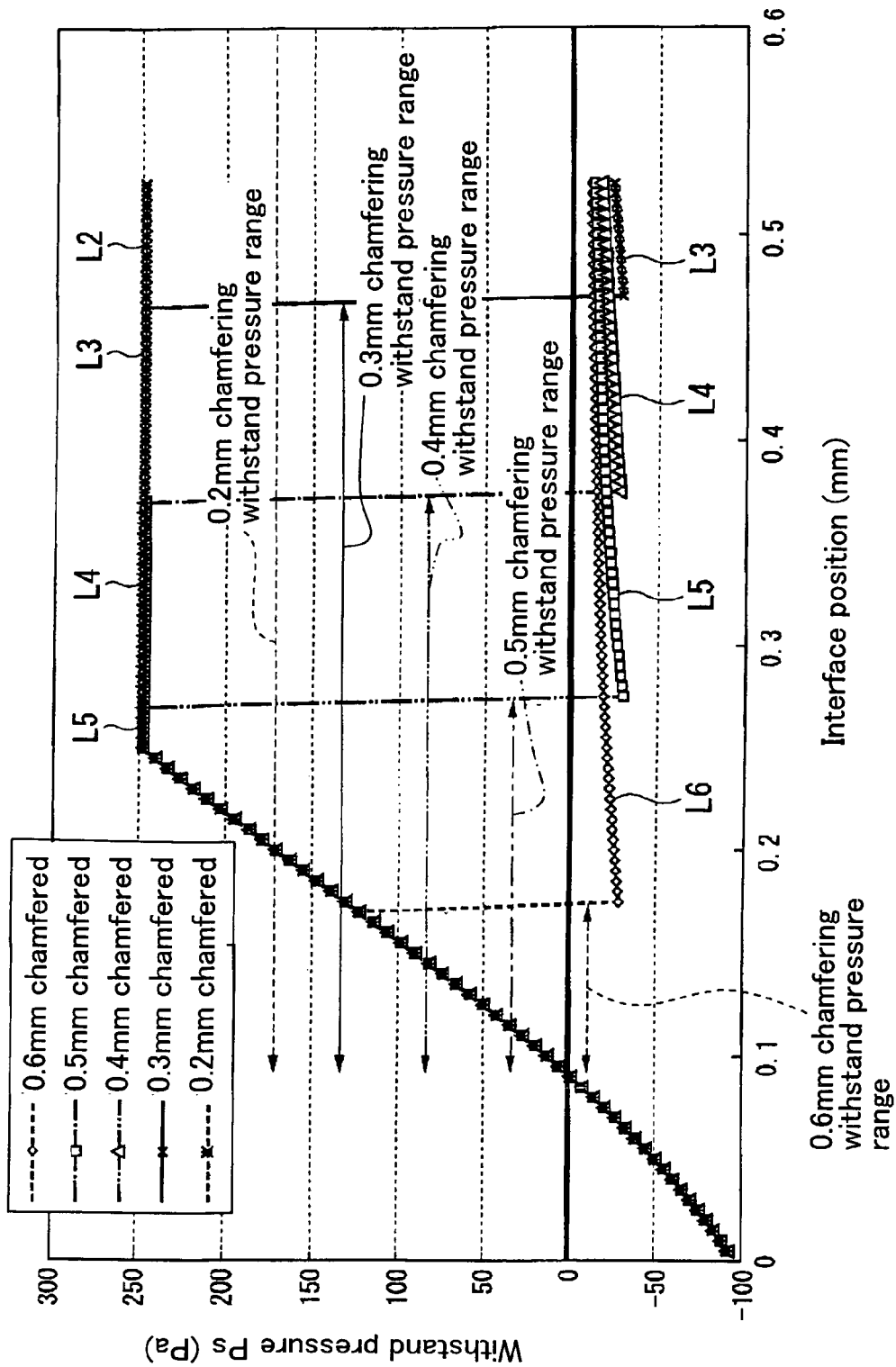
FIG. 6 is a drawing showing the result of simulation according to this embodiment.

FIG. 6 is a drawing showing the result of simulation which derives the relationship between the position of the interface L and the pressure (withstand pressure) Ps caused by the surface tension. In FIG. 6, the horizontal axis shows the position in the Z axis direction of the intersection J1 between the interface L and the side surface Pc of the substrate P based on the lower surface Pb of the substrate P, that is, in other words, the distance D8 (see FIG. 3) in the Z axis direction between the lower surface Pb of the substrate P and the intersection J1, and the vertical axis shows the withstand pressure Ps. When the withstand pressure Ps is positive, the downward movement of the interface L between the substrate P and the plate member T is restrained, and when the withstand pressure Ps is negative, the interface L moves downward. The lines L2, L3, L4, L5, and L6 respectively show the relationship between the position of the interface L and the withstand pressure Ps when the depth D6 of the chamfered portion C is 0.2 mm, 0.3 mm, 0.4 mm, 0.5 mm, and 0.6 mm.

In FIG. 6, it is assumed that the positions of the intersection J1 and the intersection J2 in the Z axis direction are the same. In FIG. 6, it is assumed that the whole of the side surface Pc of the substrate P (upper arced portion R1, first flat portion F1, lower arced portion R2) is a liquid-repellent area A1 that is liquid-repellent.

For example, when the depth D6 of the chamfered portion C is set to 0.4 mm, the position of the lower end of the second liquid-repellent flat portion F4 based on the lower surface Pb of the substrate P is 0.25 mm, and the position of the upper end is 0.375 mm. In a state that the intersection J1 (J2) of the interface L is positioned higher than 0.375 mm, the withstand pressure Ps becomes negative, and the interface L moves downward. In a state that the intersection J2 (and thus the intersection J1) of the interface L reaches the second liquid-repellent flat portion F4, the withstand pressure Ps becomes maximum (approximately 250 Pa). When the intersection J1 is set on the lower arced portion R2 of the substrate P, the withstand pressure Ps becomes lower than in the case where the intersection J1 is set on the first liquid-repellent flat portion F3, and it becomes gradually smaller as the position of the intersection J1 on the lower arced portion R2 comes closer to the lower surface Pb of the substrate P. As seen in FIG. 6, when the depth D6 of the chamfered portion C is 0.4 mm, to make the withstand pressure Ps positive, the position of the intersection J1 is set within the range of approximately 0.1 mm to 0.375 mm.

When the whole of the side surface Pc of the substrate P is the liquid-repellent area A1, and the upper surface Pa of the substrate P and the upper surface Ta of the plate member T are substantially flush with each other, in order to provide the second liquid-repellent flat portion F4, the depth D6 of the chamfered portion C is permitted to be 0.525 mm at maximum, however, by considering oscillation in the vertical direction of the interface L caused by variation of the pressure Pf, errors in placing the substrate P relative to the first holder PH1, and errors in placing the plate member T relative to the second holder PH2, the depth D6 of the chamfered portion C is set to not more than 0.5 mm. Thereby, the second liquid-repellent flat portion F4 with a desired size can be secured.

When the distance D7 between the lower surface Pb of the substrate P and the lower end of the liquid-repellent area A1 is set to be long, the size of the second liquid-repellent flat portion F4 can be made large by reducing the depth D6 of the chamfered portion C. By setting the distance D7 long, it is also possible to effectively restrain contamination of the transporting unit. When the contact angle of the liquid LQ on the liquid-repellent area A1 of the side surface Pc of the substrate P is comparatively small, it is desirable to reduce the depth of the chamfered portion C as small as possible. When the contact angle of the liquid LQ on the liquid-repellent area A1 of the side surface Pc of the substrate P is comparatively small, even when the interface L of the liquid LQ is positioned between the first liquid-repellent flat portion F3 and the second liquid-repellent flat portion F4, the withstand pressure Ps is small, so that it is necessary to make larger the second liquid-repellent flat portion F4. When the liquid-repellent area A1 of the side surface Pc of the substrate P is sufficiently large (the distance D7 is small), the second liquid-repellent flat portion F4 with a desired size can be secured even when the depth D6 of the chamfered portion C is set to be comparatively large. When the contact angle of the liquid LQ on the liquid-repellent area A1 of the side surface Pc of the substrate P is sufficiently large, the depth D6 of the chamfered portion C may be set to be large. When the contact angle of the liquid LQ on the liquid repellent area A1 of the side surface Pc of the substrate P is sufficiently large, the withstand pressure PS is great when the interface L of the liquid LQ is positioned between the first liquid-repellent flat portion F3 and the second liquid-repellent flat portion F4, so that the downward movement of the interface L of the liquid LQ can be restrained even if the second liquid-repellent flat portion F4 is small. Machinability when machining the chamfered portion C is higher as the depth D6 of the chamfered portion C becomes larger, so that the plate member T can be manufactured with favorable machinability by setting the depth D6 of the chamfered portion C to be large. Thus, the depth D6 of the chamfered portion C can be set according to the size of the liquid-repellent area A1 of the substrate P.

When the upper surface Pa of the substrate P and the upper surface Ta of the plate member T are substantially flush with each other, even if the depth D6 of the chamfered portion C is reduced to not more than 0.25 mm, at the position facing the chamfered portion C, the upper arced portion R1 of the substrate P is provided, so that in a state that the intersection J1 of the interface L is provided on the upper arced portion R1, there is a high possibility that the shape of the interface L does not become convex downward. As described above, the reduction of the depth D6 of the chamfered portion C lowers machinability, so that in terms of machining, it is desirable that the depth D6 of the chamfered portion C is set to not less than 0.25 mm.

When the depth D6 of the chamfered portion C is determined for reasons in machining, the depth (distance D7) of the liquid-repellent area A1 that is liquid-repellent can be set on the side surface Pc of the substrate P so as to face the chamfered portion C formed on the upper portion of the plate member T. Namely, the liquid-repellent area A1 of the substrate P may be set according to the depth D6 of the chamfered portion C. Even in this case, by providing the liquid-repellent area A1 so that the lower end position of the liquid-repellent area A1 of the substrate P becomes lower than the lower end position of the chamfered portion C, the second liquid-repellent flat portion F4 can be provided. For example, when the depth D6 of the chamfered portion C is set to be large, by providing the liquid-repellent area A1 on a wide area of the side surface Pc of the substrate P so as to shorten the distance D7, the second liquid-repellent flat portion F4 with a desired size can be secured. On the other hand, when the depth D6 of the chamfered portion C is small, by providing the liquid-repellent area A1 on the side surface Pc of the substrate P so as to increase the distance D7, the second liquid-repellent flat portion F4 with a desired size can be secured while preventing contamination of the transporting unit.

In view of prevention of inflow (leakage) of the liquid LQ, the second liquid-repellent flat portion F4 is preferably as large as possible, and for this, it is preferable to make larger the liquid-repellent area A1 of the side surface Pc of the substrate P and reduce the depth D6 of the chamfered portion C of the plate member T. On the other hand, for example, when a liquid-repellent material is coated to form a coating 2 to the lower end of the side surface Pc, the liquid-repellent material may adhere to and contaminate the transporting unit that holds the lower surface Pb of the substrate P and conveys the substrate P, as described above. Therefore, it is preferable that the liquid-repellent material is not coated on a predetermined area of the lower end of the side surface Pc of the substrate P. As shown in FIG. 6, even when the lower arced portion R2 is coated with the liquid-repellent material, in a state that the intersection J1 is provided on the lower arced portion R2, a sufficient withstand pressure Ps cannot be obtained regardless of the depth D6 of the chamfered portion C. When the intersections J1 and J2 are provided on the first and second liquid-repellent flat portions F3 and F4, the interface L becomes convex downward and a great withstand pressure can be obtained, so that by coating the liquid-repellent material on the first flat portion F1 facing the second flat portion F2 of the side surface Pc of the substrate P, inflow (leakage) of the liquid LQ can be effectively prevented. The position of the lower end of the first flat portion F1 based on the lower surface Pb of the substrate P is 0.25 mm, so that by setting the distance D7 between the lower surface position of the substrate P and the lower end position of the liquid-repellent area A1 (coating 2) to 0.25 mm, the whole of the first flat portion F1 can be formed into the liquid-repellent area A1. Then, by considering oscillation in the vertical direction of the interface L due to variation of the pressure Pf and machining accuracy when providing the coating 2 and the like, it is desirable to set the distance D7 between the lower surface position of the substrate P and the lower end position of the liquid-repellent area A1 (coating 2) to not less than 0.2 mm.

As described above, the chamfered portion C is provided so as to face the liquid-repellent area A1 of the side surface Pc of the substrate P, so that inflow of the liquid LQ into the side of the lower surface Pb of the substrate P via the gap between the side surface Pc of the substrate P and the inner surface Tc of the plate member T can be restrained. By optimizing the depth D6 of the chamfered portion C of the plate member T according to conditions relating to the shape of the substrate P and conditions relating to the contact angle between the substrate P and the liquid LQ, inflow (leakage) of the liquid LQ can be restrained.

In the above-described embodiment, when notching such as a notch, an orientation flat portion (ori-fla portion) and the like, is formed in the substrate P, the inner surface Tc including the chamfered portion C of the plate member T may be formed into a shape corresponding to the notching of the substrate P. In detail, a projection is provided on a part of the inner surface Tc of the plate member T so as to correspond to the notching of the substrate P, and between the notching of the substrate P and the projection of the plate member T, the gap A is also secured.

The thickness D1 of the substrate and the thickness D2 of the plate member T may be substantially equal to each other. In the above-described embodiment, the upper surface Pa of the substrate P held on the first holder PH1 and the upper surface Ta of the plate member T held on the second holder PH2 are substantially flush with each other, however, a difference in level is allowed between the upper surface Pa of the substrate P held on the first holder PH1 and the upper surface Ta of the plate member T held on the second holder PH2 as long as the optical path space K1 on the side of the image plane of the projection optical system PL can be continuously filled with the liquid LQ. In this case, the depth D6 of the chamfered portion C must be set corresponding to the difference in level.

In the above-described embodiment, a pin-chuck mechanism is used for adsorptive holding of the substrate P, however, other chuck mechanisms may be employed. Also, a pin-chuck mechanism is employed for adsorptive holding of the plate member T, however, other chuck mechanisms may be employed. In the present embodiment, a vacuum adsorption mechanism is employed for adsorptive holding of the substrate P and the plate member T, however, for holding at least one of these, other mechanisms such as an electrostatic adsorption mechanism may be used.

In the above-described embodiment, the substrate holder PH includes a base material PHB and a plate member T attachable to and detachable from the base material PHB, however, it is also allowed that the base material PHB and the plate member T are integrally provided.

In the above-described embodiment, the base material 1 is described as a wafer with a diameter of 300 mm (12 inches) and a thickness of 0.775 mm, however, the invention is also applicable to a wafer with a diameter of 200 mm (8 inches) and a thickness of 0.725 mm. The depth D6 of the chamfered portion C of the plate member T is optimized according to the shape of the substrate P and/or the contact angle of the substrate P (liquid-repellent area) with the liquid LQ, however, when the shape of the substrate P to be processed with the exposure apparatus EX and/or the contact angle of the substrate P (liquid-repellent area) with the liquid LQ change, the plate member T may be changed according to the substrate P. When the depth D6 of the chamfered portion C of the plate member T cannot be optimized, it is also possible that the shape of the substrate P and/or the contact angle of the substrate P (liquid-repellent area) with the liquid LQ are optimized according to the depth D6 of the chamfered portion C. In the above-described embodiment, the liquid-repellent area A1 is formed by the coating 2 that coats the photosensitive material, however, when the photosensitive material is liquid-repellent, the liquid-repellent area A1 may be formed from the photosensitive material. In the above-described embodiment, the chamfered portion C is formed into a flat surface having an angle of approximately 45 degrees with respect to the upper surface Ta of the plate member T, however, this angle may not be 45 degrees. In the above-described embodiment, the liquid-repellent area A1 is formed by the coating 2 that coats the photosensitive material, however, the liquid-repellent area A1 may be formed by a liquid-repellent coating (layer) formed under the photosensitive material on the base material 1. In the above-described embodiment, the contact angle $\theta_P$ of the liquid LQ on the side surface Pc (first liquid-repellent flat portion F3) of the substrate P is 110 degrees, the contact angle $\theta_T$ of the liquid LQ on the inner surface Tc (second flat portion F4) of the plate member T is also 110 degrees, the sum of the contact angle $\theta_P$ of the liquid LQ on the side surface Pc (first liquid-repellent flat portion F3) of the substrate P and the contact angle $\theta_T$ of the liquid LQ on the inner surface Tc (second flat portion F4) of the plate member T is greater than 180 degrees, and when the sum of the contact angle $\theta_P$ and the contact angle $\theta_T$ becomes greater than 180 degrees, the contact angle $\theta_P$ and the contact angle $\theta_T$ are allowed to be different from each other. For example, even when the contact angle $\theta_P$ of the liquid LQ on the side surface Pc (first liquid-repellent flat portion F3) of the substrate P is 60 through 90 degrees, if the contact angle $\theta_T$ of the liquid LQ on the inner surface Tc (second flat portion F4) of the plate member T is not less than 120 degrees, inflow of the liquid LQ into the back surface Pb side of the substrate P can be restrained by the surface tension and the like, of the liquid LQ. In this case, as the coating 2 of the above-described embodiment, HMDS coating (layer) may be formed. As described above, by setting the contact angle of the liquid LQ on the surface (upper surface Pa) of the substrate P and the contact angle of the liquid LQ on the surface (upper surface Ta) of the plate member T to be substantially equal to each other (for example, approximately 110 degrees), changes in pressure of the liquid LQ can be restrained even when the liquid immersion area LR passes above the gap A between the substrate P and the plate member T, so that leakage of the liquid LQ into the back surface side of the substrate can be restrained. In this case, the plate member may be coated with the same material as that of the coating forming the liquid-repellent area A1 of the substrate P. However, the contact angle of the liquid LQ on the surface (upper surface Pa) of the substrate P and the contact angle of the liquid LQ on the surface (upper surface Ta) of the plate member T may be different from each other.

As described above, pure water is used as the liquid LQ in the present embodiment. Pure water is easily acquired in large amounts in a semiconductor manufacturing factory and the like, and has an advantage that it has no harmful influence on the photoresist and optical element (lens) and the like, on the substrate P. Pure water also has no harmful influence on the environment, and contains an extremely small content of impurities, so that it can be expected to clean the surface of the substrate P and the surface of an optical element provided on the end surface of the projection optical system PL. When purity of pure water supplied from a factory and the like, is low, the exposure apparatus may be provided with an ultra-pure-water producing unit.

It is generally said that the refractive index n of pure water (water) with respect to the exposure light beam EL with a wavelength of approximately 193 nm is approximately 1.44, and when an ArF excimer laser beam (wavelength: 193 nm) is used as the light source of the exposure light beam EL, the wavelength is shortened to 1/n, that is, approximately 134 nm on the substrate P and high resolution is obtained. Furthermore, the depth of focus is increased to approximately n times, that is, approximately 1.44 times that in the air, so that when a depth of focus equivalent to that in use in the air is only required, the numerical aperture of the projection optical system PL can be increased, and this point also improves the resolution.

In this embodiment, the optical element LS1 is attached to the end of the projection optical system PL and the optical characteristics of the projection optical system PL, for example, aberrations (spherical aberration, coma aberration and the like) can be adjusted by this lens. The optical element to be attached to the end of the projection optical system PL may be an optical plate which is used for adjustments of optical characteristics of the projection optical system PL. Alternatively, it may be a plane parallel plate through which the exposure light beam EL is transmissive.

When the pressure between the end of the projection optical system PL and the substrate P, caused by the flow of the liquid LQ, is great, the optical element may not be made exchangeable but may be firmly fixed so as not to be moved by the pressure. The structure of the liquid immersion mechanism 100 including the nozzle member 70 and the like, is not limited to the above-described structure, and for example, the structures described in European Patent Application Laid-open No. 1420298 and International Patent Application Laid-open Nos. 2004/055803, 2004/057590, and 2005/029559 can also be used.

In this embodiment, the area between the projection optical system PL and the surface of the substrate P is filled with the liquid LQ, however, it is also possible that the liquid LQ is filled in a state that, for example, a cover glass formed of a plane parallel plate is attached to the surface of the substrate P.

In the projection optical system of the above-described embodiment, the optical path space on the side of the image plane of the optical element on the end is filled with the liquid, however, as disclosed in International Patent Publication Pamphlet No. 2004/019128, a projection optical system in which an optical path space on the mask side of the optical element on the end is also filled with the liquid can also be employed.

The liquid LQ in the present embodiment is water, however, it may be a liquid other than water. For example, when the light source of the exposure light beam EL is an $F_2$ laser, the $F_2$ laser beam is not transmitted through water, so that as the liquid LQ, a fluorinated fluid through which the $F_2$ laser beam is transmissive such as perfluoropolyether (PFPE) or fluorinated oil can be used. In this case, lyophilic treatment is performed by forming a thin film from a substance that contains, for example, fluorine and has a molecular structure whose polarity is small on a portion that comes into contact with the liquid LQ. As the liquid LQ, a liquid (for example, cedar oil) that can transmit the exposure light beam EL and is as high as possible in refractive index and stable against the photoresist coated on the projection optical system PL and the surface of the substrate P can also be used. A liquid LQ having a refractive index of approximately 1.6 through 1.8 may also be used. In addition, the optical element LS1 may be formed from a material having a refractive index (for example, not less than 1.6) higher than that of silica glass and calcium fluoride. As the liquid LQ, various liquids, for example, a supercritical liquid can also be used.

Those applicable as the substrate P of the respective embodiments include a glass substrate for a display device, a ceramic wafer for a thin-film magnetic head, a master plate (synthetic silica glass, silicon wafer) of the mask or the reticle to be used in the exposure apparatus as well as the semiconductor wafer for manufacturing semiconductor devices, and the like.

As for the exposure apparatus EX, the present invention is also applicable to the scanning type exposure apparatus (scanning stepper) of the step-and-scan manner for performing the scanning exposure for the pattern of the mask M by synchronously moving the mask M and the substrate P as well as the projection exposure apparatus (stepper) of the step-and-repeat manner for performing the full field exposure for the pattern of the mask M in a state that the mask M and the substrate P are allowed to stand still, while successively step-moving the substrate P.

As the exposure apparatus EX, the present invention is also applicable to an exposure apparatus for performing the full field exposure of the substrate P with a reduced image of a first pattern in a state that the first pattern and the substrate P are allowed to substantially stand still by a projection optical system (for example, a refractive type projection optical system that has a reduction magnification of ⅛ and includes no reflecting element). In this case, the present invention is also applicable to the full field exposure apparatus of the stitch manner for performing the full field exposure for a reduced image of a second pattern on the substrate P by partially overlaying it on the first pattern after the full field exposure of the first pattern by the projection optical system while the second pattern and the substrate P substantially stand still. As the exposure apparatus of the stitch manner, the present invention is also applicable to the exposure apparatus of the step-and-stitch manner in which at least two patterns are partially overlaid and transferred on the substrate P and the substrate P is moved in order. In the above-described embodiment, an exposure apparatus including the projection optical system PL is described as an example, however, the invention is also applicable to an exposure apparatus and an exposure method which do not use the projection optical system PL. Thus, even when the projection optical system PL is not used, a substrate is irradiated with an exposure light beam via an optical member such as a lens and a liquid immersion area is formed in a predetermined space between the optical member and the substrate.

The present invention is also applicable to a twin-stage type exposure apparatus including a plurality of substrate stages as disclosed in Japanese Patent Application Laid open Nos. H10-163099 and H10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), or U.S. Pat. No. 6,208,407, contents of those United States patents are incorporated herein by reference within a range of permission of the domestic laws and ordinances of the state designated or selected in this international application.

Furthermore, the invention is also applicable to an exposure apparatus including a substrate stage for holding a substrate and a measuring stage carrying a reference member having a reference mark and/or various photoelectric sensors as disclosed in Japanese Patent Application Laid open No. H11-135400 and 2000-164504.

In the above-described embodiment, a light-transmissive type mask having a predetermined light-shielding pattern (or phase pattern or light-reducing or dimming pattern) formed on a light transmissive substrate is used, however, instead of this mask, for example, as disclosed in U.S. Pat. No. 6,778,257, an electronic mask which forms a transmissive pattern, reflective pattern, or light-emitting pattern based on electronic data of a pattern to be exposed can also be used.

The invention is also applicable to an exposure apparatus (lithography system) which forms a line-and-space pattern on a substrate P by forming an interference pattern on the substrate P as disclosed in International Patent Publication Pamphlet No. 2001/035168.

As described above, the exposure apparatus EX according to the embodiment of the present invention is produced by assembling the various subsystems including the respective constitutive elements as defined in the claims so that the predetermined mechanical accuracy, the electric accuracy, and the optical accuracy are maintained. In order to secure the various accuracies, adjustments performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include the mechanical connection, the wiring connection of the electric circuits, and the piping connection of the air pressure circuits in correlation with the various subsystems. It is obvious that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are controlled.

Figure 7:
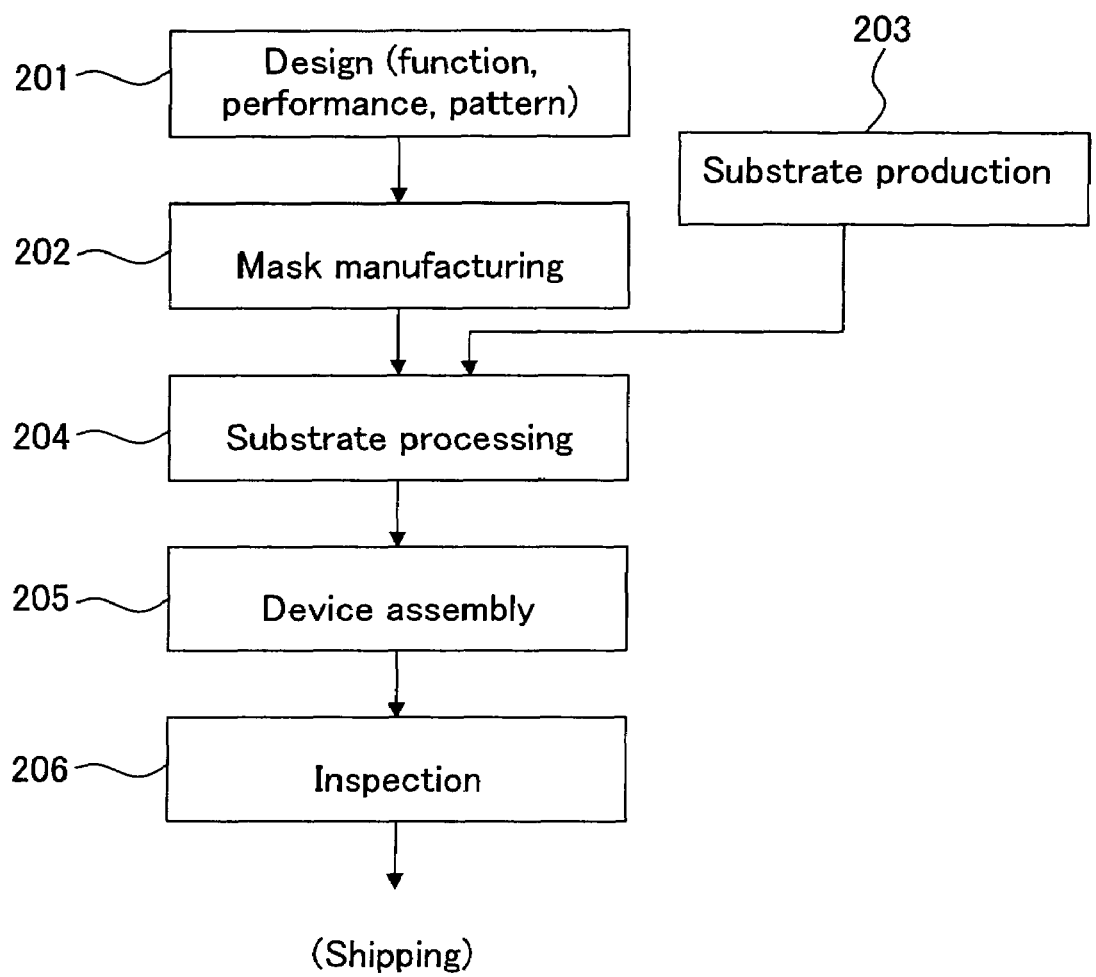
FIG. 7 is a flowchart showing an example of a microdevice manufacturing process.

As shown in FIG. 7, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a step 204 of a substrate processing (exposure process) for exposing the substrate with a pattern of the mask by the exposure apparatus EX of the above-described embodiment and developing the exposed substrate, a step 205 of assembling the device (including a dicing step, a bonding step, and a packaging step), and an inspection step 206.

INDUSTRIAL APPLICABILITY

As for the types of the exposure apparatuses EX, the invention is not limited to the exposure apparatus for manufacturing a semiconductor device which exposes a substrate P with a semiconductor device pattern, and is also widely applicable, for example, to the exposure apparatus for producing the liquid crystal display device or for producing the display as well as the exposure apparatus for producing, for example, the thin film magnetic head, the image pickup device (CCD), the reticle, the mask, and the like.

The invention claimed is:

1. A substrate holding device which holds a substrate to be exposed through a liquid, comprising:
   a holder which holds the substrate;
   a predetermined surface which faces a side surface of the substrate held on the holder via a predetermined gap and is liquid-repellent; and
   a chamfered portion formed on an upper portion of the predetermined surface, wherein:
   the side surface of the substrate is provided with a liquid-repellent area which is liquid-repellent, and
   the chamfered portion is provided to face the liquid-repellent area of the substrate held on the holder.

2. The substrate holding device according to claim 1, wherein a depth of the chamfered portion is set according to the liquid-repellent area of the substrate.

3. The substrate holding device according to claim 1, wherein a lower end of the chamfered portion is set at a position higher than a lower end of the liquid-repellent area of the substrate.

4. The substrate holding device according to claim 1, further comprising a liquid-repellent upper surface extending from the chamfered portion on the upper portion of the predetermined surface so as to be substantially flush with a surface of the substrate held on the holder.

5. The substrate holding device according to claim 4, wherein a thickness of the substrate is approximately 0.775 mm, and a depth of the chamfered portion is not more than 0.5 mm.

6. The substrate holding device according to claim 1, wherein a sum of a contact angle of the liquid-repellent area of the substrate with the liquid and a contact angle of the predetermined surface with the liquid is greater than 180 degrees.

7. The substrate holding device according to claim 1, wherein the liquid-repellent area is an area in which a liquid-repellent material is coated on a base material of the substrate.

8. The substrate holding device according to claim 1, wherein the predetermined gap is 0.1 to 0.5 mm.

9. The substrate holding device according to claim 1, wherein the predetermined surface is provided to surround the side surface of the substrate.

10. The substrate holding device according to claim 1, wherein no liquid-repellent area is formed on a back surface of the substrate.

11. The substrate holding device according to claim 1, wherein the chamfered portion is coated with a liquid-repellent material.

12. The substrate holding device according to claim 1, wherein sectional shapes of an upper side portion and a lower side portion of the substrate are arced.

13. The substrate holding device according to claim 1, wherein a chamfering angle of the chamfered portion is approximately 45 degrees.

14. An exposure apparatus comprising the substrate holding device as defined in claim 1, and exposing a substrate held on the substrate holding device through a liquid.

15. A device manufacturing method comprising: exposing a substrate by the exposure apparatus as defined in claim 14; developing the exposed substrate; and processing the developed substrate.

16. An exposure method for exposing a substrate through a liquid, comprising:
   making a side surface of the substrate face a predetermined surface having liquid-repellency via a predetermined gap; and
   exposing the substrate through the liquid,
   wherein a chamfered portion is formed on an upper portion of the predetermined surface, and a liquid-repellent area is provided on the side surface of the substrate so as to face the chamfered portion.

17. The exposure method according to claim 16, wherein the liquid-repellent area of the substrate is set according to a depth of the chamfered portion.

18. The exposure method according to claim 16, wherein the liquid-repellent area is set so that a lower end position of the liquid-repellent area of the substrate becomes lower than a lower end position of the chamfered portion.

19. The exposure method according to claim 18, wherein a distance between the lower surface position of the substrate and the lower end position of the liquid-repellent area is not less than 0.2 mm.

20. The exposure method according to claim 16, wherein a sectional shape of a first area including an upper portion of the side surface of the substrate is curved, a sectional shape of a second area under the first area is a plane, and the liquid-repellent area includes the first area and at least a part of the second area.

21. The exposure method according to claim 16, wherein the liquid-repellent area is an area coated with a liquid-repellent material on a base material of the substrate.

22. A device manufacturing method comprising: exposing a substrate by the exposure method as defined in claim 16, developing the exposed substrate, and processing the developed substrate.

23. A plate member used in an exposure apparatus which exposes a substrate held on a substrate holding device by irradiating a surface of the substrate with an exposure light beam through a liquid, the plate member comprising:
a predetermined surface which faces a side surface of the substrate held on the substrate holding device via a predetermined gap and which has a liquid-repellency; and
a chamfered portion formed on an upper portion of the predetermined surface,
wherein the chamfered portion is provided to face a liquid-repellent area on the side surface of the substrate held on the substrate holding device.

24. The plate member according to claim 23, wherein the plate member is held by sucking by the substrate holding device and is releasable.

25. The plate member according to claim 23, wherein a depth of the chamfered portion is set according to the liquid-repellent area of the substrate.

26. The plate member according to claim 25, wherein the depth of the chamfered portion is set according to a contact angle of the liquid-repellent area with the liquid.

27. The plate member according to claim 23, wherein a lower end of the chamfered portion is set at a position higher than a lower end of the liquid-repellent area of the substrate.

28. The plate member according to claim 23, further comprising a liquid-repellent upper surface extending from the chamfered portion on the upper portion of the predetermined surface so as to be substantially flush with a surface of the substrate held on the holder.

29. The plate member according to claim 23, wherein a sum of a contact angle of the liquid-repellent area of the substrate with the liquid and a contact angle of the predetermined surface with the liquid is greater than 180 degrees.

30. The plate member according to claim 23, wherein the predetermined gap is 0.1 to 0.5 mm.

31. A substrate holding device which holds a substrate to be exposed through a liquid, comprising:
a holder which holds the substrate; and
a predetermined surface which faces a side surface of the substrate held on the holder via a gap, wherein
the predetermined surface includes a flat portion which is substantially parallel to the side surface of the substrate held on the holder and a chamfered portion which extends to a position above the flat portion, and
a sum of a contact angle of the side surface of the substrate with the liquid and a contact angle of the flat portion of the predetermined surface with the liquid is greater than 180 degrees.

32. The substrate holding device according to claim 31, further comprising a liquid-repellent upper surface extending from the chamfered portion so as to be substantially flush with a surface of the substrate held on the holder.

33. The substrate holding device according to claim 31, wherein the flat portion of the predetermined surface is an area coated with a predetermined material on a base material of the substrate.

34. The substrate holding device according to claim 31, wherein the predetermined surface is provided to surround the side surface of the substrate.

35. The substrate holding device according to claim 31, wherein a chamfering angle of the chamfered portion is approximately 45 degrees.

36. The substrate holding device according to claim 31, wherein a thickness of the substrate is approximately 0.775 mm, and a depth of the chamfered portion is not more than 0.5 mm.

37. An exposure apparatus comprising: the substrate holding device as defined in claim 31, and exposing a substrate held on the substrate holding device through a liquid.

38. A device manufacturing method comprising: exposing a substrate by the exposure apparatus as defined in claim 37; developing the exposed substrate; and processing the developed substrate.

39. A plate member used in an exposure apparatus which exposes a substrate held on a substrate holding device by irradiating an exposure light beam onto a surface of the substrate through a liquid, wherein:
the plate member has a predetermined surface which faces a side surface of the substrate held on the substrate holding device via a predetermined gap;
the predetermined surface includes a flat portion which is substantially parallel to the side surface of the substrate held on the holder and a chamfered portion which extends to a position above the flat portion; and
a sum of a contact angle of the side surface of the substrate with the liquid and a contact angle of the flat portion of the predetermined surface with the liquid is greater than 180 degrees.

* * * * *

UNITED STATES PATENT AND TRADEMARK OFFICE
CERTIFICATE OF CORRECTION

PATENT NO. : 7,705,968 B2  Page 1 of 1
APPLICATION NO. : 10/594963
DATED : April 27, 2010
INVENTOR(S) : Hiroyuki Nagasaka et al.

It is certified that error appears in the above-identified patent and that said Letters Patent is hereby corrected as shown below:

Title Page

Item (86) PCT No.:   PCT/JP2006/005535 should be corrected to reflect:

Item (86) PCT No.:   PCT/JP2006/305535

Signed and Sealed this

Sixth Day of July, 2010

David J. Kappos
*Director of the United States Patent and Trademark Office*